US012620432B2

(12) United States Patent
Krishnamoorthy et al.

(10) Patent No.: US 12,620,432 B2
(45) Date of Patent: May 5, 2026

(54) DELAY ADJUSTER BASED CLOCK QUALIFIER TIMING ENHANCEMENT FOR MEMORY INTERFACE

(71) Applicant: QUALCOMM Incorporated, San Diego, CA (US)

(72) Inventors: Satish Krishnamoorthy, San Diego, CA (US); Yong Xu, San Diego, CA (US); Boris Dimitrov Andreev, San Diego, CA (US); Patrick Isakanian, El Dorado Hills, CA (US); Farrukh Aquil, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 179 days.

(21) Appl. No.: 18/439,464

(22) Filed: Feb. 12, 2024

(65) Prior Publication Data

US 2025/0259665 A1 Aug. 14, 2025

(51) Int. Cl.
G11C 11/4076 (2006.01)
G11C 11/4093 (2006.01)
H03K 5/156 (2006.01)

(52) U.S. Cl.
CPC ...... G11C 11/4076 (2013.01); G11C 11/4093 (2013.01); H03K 5/1565 (2013.01)

(58) Field of Classification Search
CPC ............ G11C 11/4076; G11C 11/4093; G11C 2207/2254; G11C 7/1066; G11C 7/222; G11C 29/023; G06F 13/1689
See application file for complete search history.

(56) References Cited

U.S. PATENT DOCUMENTS

| | | | | |
|---|---|---|---|---|
| 2010/0124131 A1* | 5/2010 | Onishi | ................... | G11C 7/225 365/194 |
| 2012/0300564 A1 | 11/2012 | Dreps et al. | | |
| 2013/0290766 A1* | 10/2013 | Nguyen | ................... | G06F 1/12 713/400 |
| 2014/0226420 A1* | 8/2014 | Best | ................... | G06F 13/1689 365/193 |
| 2015/0124539 A1* | 5/2015 | Iijima | ................... | G11C 7/1093 365/193 |
| 2016/0049183 A1 | 2/2016 | Bose et al. | | |
| 2016/0118103 A1 | 4/2016 | Iljima | | |

(Continued)

FOREIGN PATENT DOCUMENTS

EP 2577667 B1 6/2019

OTHER PUBLICATIONS

International Search Report and Written Opinion—PCT/US2024/061544—ISA/EPO—Mar. 26, 2025.

*Primary Examiner* — Mushfique Siddique
(74) *Attorney, Agent, or Firm* — Loza & Loza, LLP

(57) ABSTRACT

A method for operating a memory interface circuit includes generating an internal data strobe signal based on a first data strobe signal and a second data strobe signal using a first receiver, generating a qualifier signal based on the second data strobe signal and a reference voltage using a second receiver, delaying a rise time and a fall time of the qualifier signal using a delay adjuster, generating a gate control signal based on the internal data strobe signal and the qualifier signal after the delay adjuster, and gating a portion of the internal data strobe signal based on the gate control signal to provide a read clock signal.

17 Claims, 18 Drawing Sheets

(56)          References Cited

U.S. PATENT DOCUMENTS

| 2017/0004866 A1* | 1/2017 | Kizer | G11C 11/4072 |
| 2018/0090190 A1* | 3/2018 | Hong | G11C 5/147 |
| 2018/0165023 A1* | 6/2018 | Oh | G06F 13/16 |
| 2021/0151091 A1* | 5/2021 | Jeon | G11C 11/4093 |
| 2024/0105243 A1* | 3/2024 | Xu | G11C 7/222 |

* cited by examiner

1200

Sweep the fall time delay or the rise time delay of the DA

1210

For each delay settings of the rise time delay or the fall time delay, determine whether one or more timing requirements are met

1220

Select one of the delay settings for the rise time delay or the fall time delay meeting the one or more timing requirements

1230

DELAY ADJUSTER BASED CLOCK QUALIFIER TIMING ENHANCEMENT FOR MEMORY INTERFACE

BACKGROUND

Field

Aspects of the present disclosure relate generally to memory, and more particularly, to memory interface circuits.

Background

A mobile device may include one or more processors and one or more memory devices for storing data and/or instructions for the one or more processors. For example, the one or more memory devices may be implemented with synchronous dynamic random-access memory (SDRAM) such as low-power double data rate (LPDDR) SDRAM. The one or more processors may access the one or more memory devices using a memory controller, which interfaces with the one or more memory devices via a memory interface circuit.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a memory interface circuit. The memory interface circuit includes a first receiver having a first input, a second input, and an output, wherein the first input of the first receiver is configured to receive a first data strobe signal, and the second input of the first receiver is configured to receive a second data strobe signal. The memory interface circuit also includes a second receiver having a first input, a second input, and an output, wherein the first input of the second receiver is configured to receive the second data strobe signal, and the second input of the second receiver is configured to receive a first reference voltage. The memory interface circuit also includes a gating circuit having a first input, a second input, and an output, wherein the first input of the gating circuit is coupled to the output of the first receiver. The memory interface circuit also includes a gate control circuit having a first input, a second input, and an output, wherein the second input of the gate control circuit is coupled to the output of the first receiver, and the output of the gate control circuit is coupled to the second input of the gating circuit. The memory interface circuit further includes a delay adjuster coupled between the output of the second receiver and the first input of the gate control circuit.

A second aspect relates to a method for operating a memory interface circuit. The method includes generating an internal data strobe signal based on a first data strobe signal and a second data strobe signal using a first receiver, generating a qualifier signal based on the second data strobe signal and a reference voltage using a second receiver, delaying a rise time and a fall time of the qualifier signal using a delay adjuster, generating a gate control signal based on the internal data strobe signal and the qualifier signal after the delay adjuster, and gating a portion of the internal data strobe signal based on the gate control signal to provide a read clock signal.

A third aspect relates to a method for training a delay adjuster in a memory interface circuit. The memory interface circuit includes a first receiver, a gating circuit coupled to the first receiver, a gate control circuit coupled to the gating circuit, and a second receiver, wherein the delay adjuster is coupled between the second receiver and the gate control circuit. The method includes sweeping a fall time delay or a rise time delay of the delay adjuster to different delay settings. The method also includes, for each of the delay settings, determining whether one or more timing requirements in the memory interface circuit are met. The method further includes selecting one of the delay settings meeting the one or more timing requirements.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
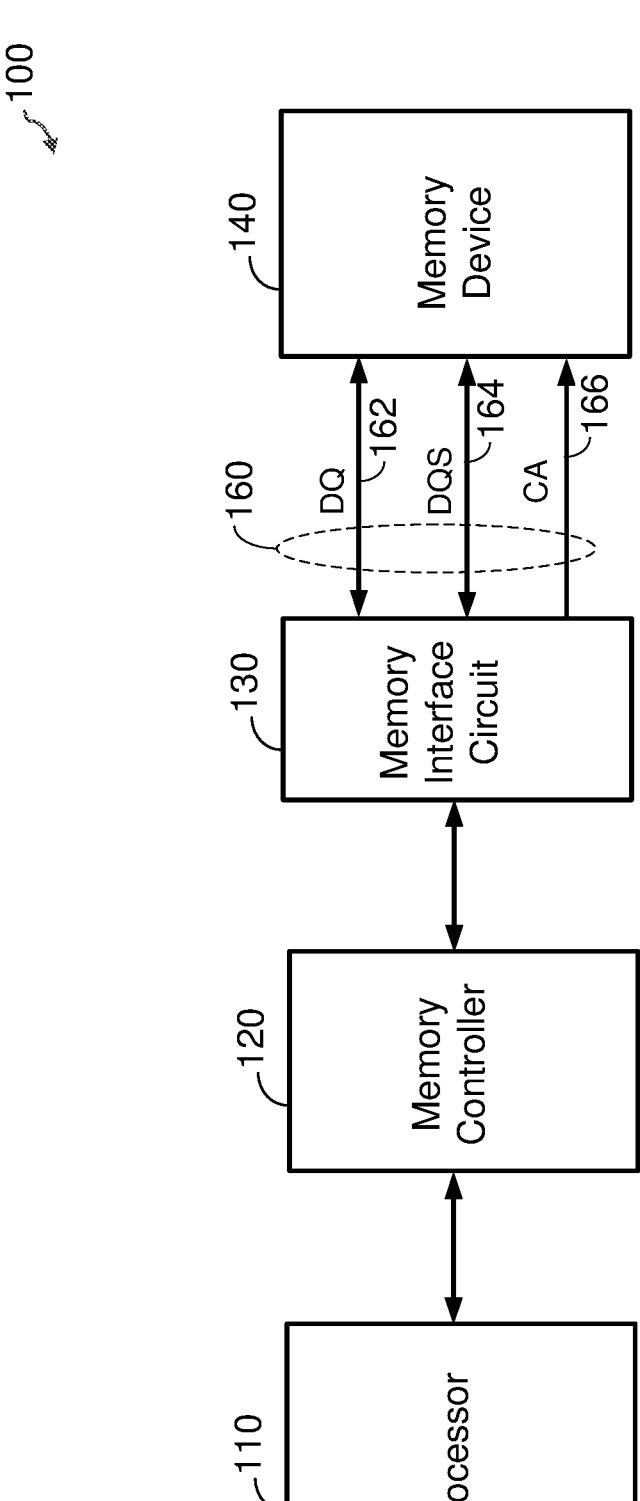
FIG. 1A shows an example of a system including a processor, a memory controller, a memory interface circuit, and a memory device according to certain aspects of the present disclosure.

FIG. 1A shows an example of a system 100 in which aspects of the present disclosure may be used. The system 100 may be included in a mobile device (e.g., a smartphone, a laptop computer, a tablet, an Internet of things (IoT) device, etc.). However, it is to be appreciated that the present disclosure is not limited to mobile devices.

In the example shown in FIG. 1A, the system 100 includes a processor 110, a memory controller 120, a memory interface circuit 130, and a memory device 140. The memory device 140 may be used to store data and/or instructions for the processor 110. The processor 110 is coupled to the memory controller 120, which is configured to provide the processor 110 with access to the memory device 140, as discussed further below. The processor 110 may include a central processing unit (CPU), a modem processor, a graphics processor, a processor core, etc. Although one processor 110 is shown in FIG. 1A, it is to be appreciated that the memory controller 120 may be configured to provide multiple processors with access to the memory device 140.

The memory controller 120 is coupled to the memory interface circuit 130, which interfaces the memory controller 120 with the memory device 140, as discussed further below. The memory interface circuit 130 is coupled to the memory device 140 via multiple channels 160, which may include, for example, one or more data (DQ) channels 162, one or more data strobe (DQS) channels 164, and one or more command-address (CA) channels 166. The channels may also be referred to as links, buses, or lines, and the memory interface circuit 130 may also be referred to as a physical layer (PHY) circuit or another term. The memory device 140 may include synchronous dynamic random-access memory (SDRAM) or another type of memory. For example, the memory device 140 may include low-power double data rate (LPDDR) SDRAM to conserve power (e.g., extend the battery life of the mobile device). In this example, the double data rate (DDR) increases the data transfer rate of the memory device 140 by transferring data on both the rising and falling edges of a clock signal. For the example of DDR, the memory controller 120 may also be referred to as a DDR controller.

As discussed above, the memory controller 120 provides the processor 110 with access to the memory device 140. For example, the memory controller 120 may read data from the memory device 140 and forward the read data to the processor 110. The memory controller 120 may also write data from the processor 110 to the memory device 140.

For example, to read data from the memory device 140, the processor 110 may send a read request to the memory controller 120 requesting data from the memory device 140. In response to the read request, the memory controller 120 sends a read command and the address of the requested data to the memory interface circuit 130, which transmits the read command and the address to the memory device 140 via the one or more CA channels 166. The memory device 140 receives the read command and the address, and reads the requested data from memory (e.g., an array of memory cells) at the address. The memory device 140 may then transmit a data signal DQ including the read data to the memory interface circuit 130 via the one or more DQ channels 162. The memory device 140 may also transmit a data strobe signal DQS to the memory interface circuit 130 via the one or more DQS channels 164.

The memory interface circuit 130 receives the data signal DQ and the data strobe signal DQS from the memory device 140. The memory interface circuit 130 generates an internal clock signal based on the data strobe signal DQS, and uses the internal clock signal to capture the read data from the data signal DQ. The memory interface circuit 130 sends the captured read data to the memory controller 120, which forwards the read data to the processor 110.

Figure 1B:
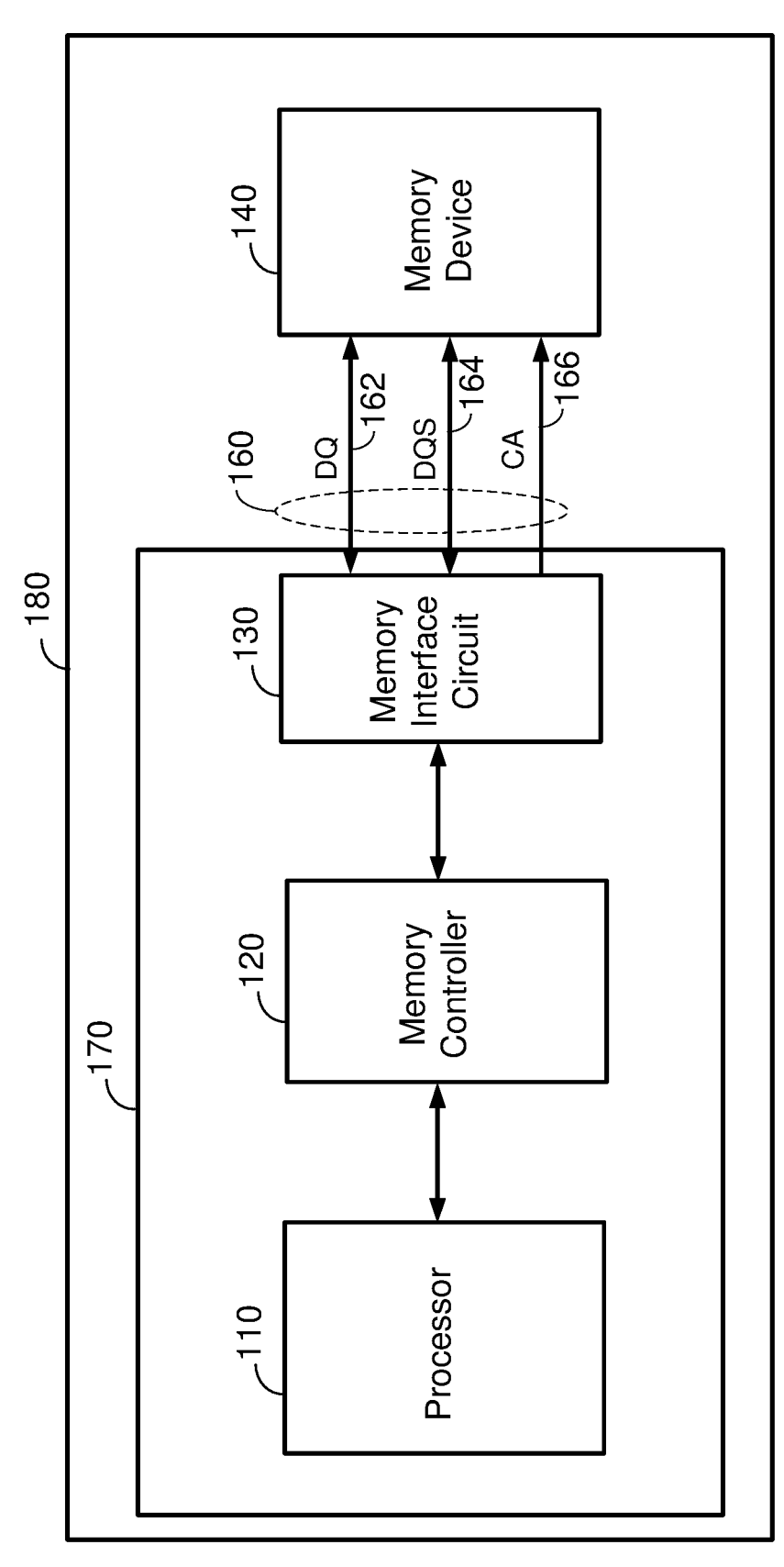
FIG. 1B shows an example in which the processor and the memory controller are integrated on a chip and the memory device is external to the chip according to certain aspects of the present disclosure.

FIG. 1B shows an example in which the processor 110, the memory controller 120, and the memory interface circuit 130 are integrated on a chip 170 (e.g., a system on chip (SoC)), and the memory device 140 is external to the chip 170. The chip 170 may include additional circuits not shown in FIG. 1B. In the example shown in FIG. 1B, the chip 170 and the memory device 140 are mounted on a substrate 180 (e.g., a printed circuit board (PCB)). In this example, the multiple channels 160 may be implemented with metal traces on the substrate 180. However, it is to be appreciated that the present disclosure is not limited to this example.

Figure 2:
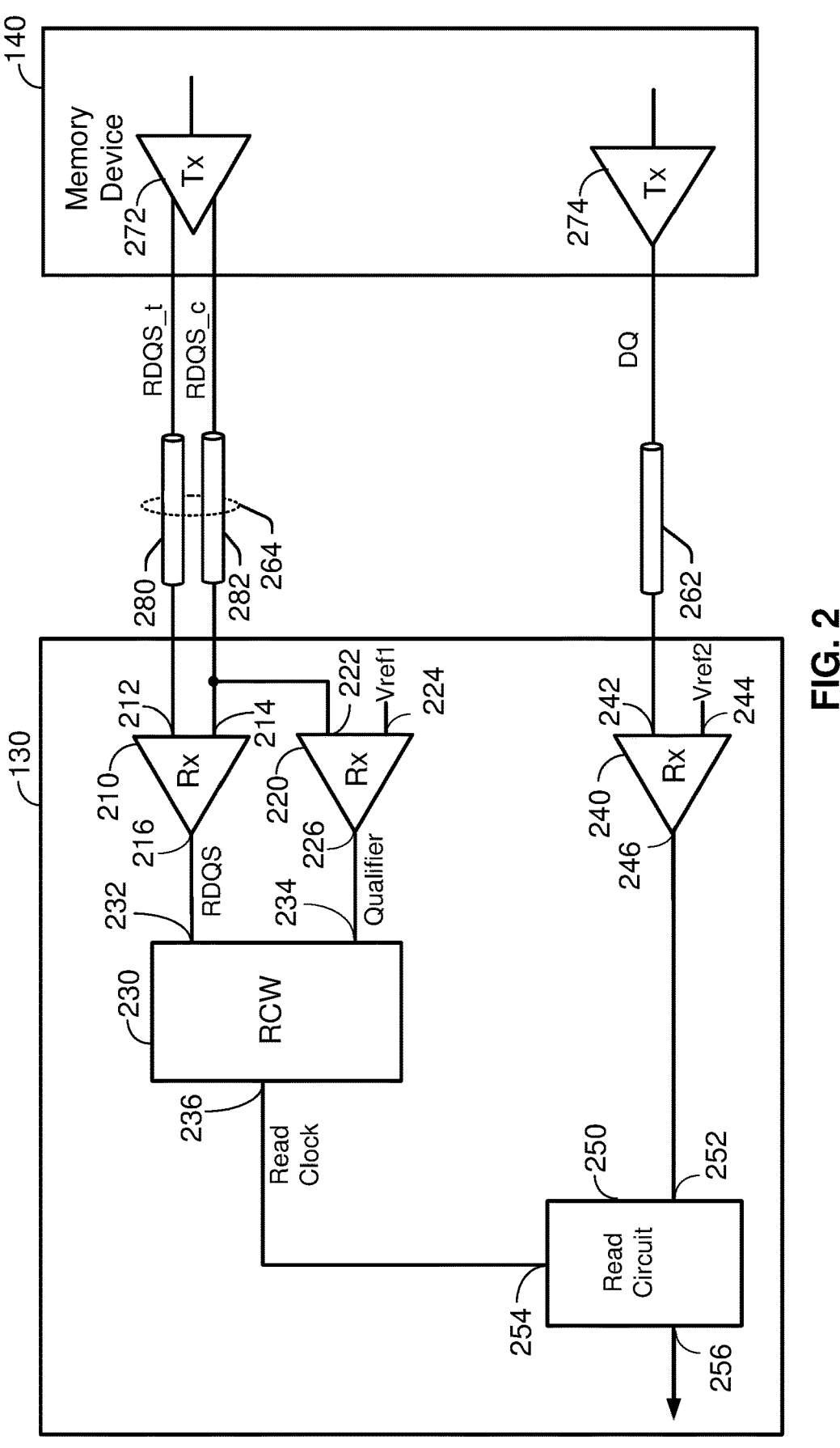
FIG. 2 shows an exemplary implementation of a memory interface circuit according to certain aspects of the present disclosure.

FIG. 2 shows an exemplary implementation of the memory interface circuit 130 according to certain aspects of the present disclosure. In this example, the memory interface circuit 130 includes circuitry for receiving read data from the memory device 140 including a first receiver 210, a second receiver 220, a third receiver 240, a read capture window (RCW) circuit 230, and a read circuit 250. For ease of discussion, circuitry for writing data to the memory device 140 is omitted from FIG. 2.

In this example, the first receiver 210 is a differential receiver configured to receive a differential read data strobe signal from the memory device 140 via a data strobe channel 264. As discussed further below, the memory interface circuit 130 uses the differential read data strobe signal to generate a read clock signal for capturing read data from the memory device 140. The differential read data strobe signal includes a first strobe signal RDQS_t and a second strobe signal RDQS_c. The data strobe channel 264 may correspond to one of the one or more DQS channels 164 shown in FIGS. 1A and 1B. In this example, the data strobe channel 264 includes a first transmission line 280 for transporting the first strobe signal RDQS_t and a second transmission line 282 for transporting the second strobe signal RDQS_c.

The first receiver 210 has a first input 212, a second input 214, and an output 216. The first input 212 is coupled to the first transmission line 280 to receive the first strobe signal RDQS_t from a transmitter 272 in the memory device 140, and the second input 214 is coupled to the second transmission line 282 to receive the second strobe signal RDQS_c from the transmitter 272 in the memory device 140. The first receiver 210 is configured to convert the differential read data strobe signal into a single-ended read data strobe signal RDQS, and output the single-ended read data strobe signal RDQS at the output 216. The read data strobe signal RDQS may also be referred to as an internal data strobe signal, which is generated internally in the memory interface circuit 130 based on the strobe signals RDQS_t and RDSC_t received from the memory device 140.

The second receiver 220 has a first input 222, a second input 224, and an output 226. In this example, the first input 222 is coupled to the second transmission line 282 to receive the second strobe signal RDQS_c, and the second input 224 is configured to receive a first reference voltage Vref1 (e.g., a first direct current (DC) reference voltage). In this example, the second receiver 220 is configured to generate a qualifier signal based on the second strobe signal RDQS_c and the first reference voltage Vref1, and output the qualifier signal at the output 226. For example, the second receiver 220 may pull the qualifier signal high (i.e., logic one) when the second strobe signal RDQS_c is greater than the first reference voltage Vref1, and pull the qualifier signal low (i.e., logic zero) when the second strobe signal RDQS_c is less than the first reference voltage Vref1. In this example, the second receiver 220 is implemented with a pseudo-differential receiver. A used herein, a "pseudo-differential receiver" is a differential receiver that has one of a pair of its inputs coupled to a reference voltage.

The RCW circuit 230 has a first input 232, a second input 234, and an output 236. The first input 232 is coupled to the output 216 of the first receiver 210 to receive the read data strobe signal RDQS, and the second input 234 is coupled to the output 226 of the second receiver 220 to receive the qualifier signal. As discussed further below, the RCW circuit 230 is configured to filter out (e.g., gate) a preamble in the data strobe signal RDQS to provide a read clock signal at the output 236 of the RCW circuit 230. The output 236 of the RCW circuit 230 may be coupled to the read circuit 250, as shown in FIG. 2.

The third receiver 240 has a first input 242, a second input 244, and an output 246. In this example, the first input 242 is coupled to a data channel 262 to receive a data signal DQ from a transmitter 274 in the memory device 140 via the data channel 262. The data signal DQ includes read data (e.g., read data bits) from the memory device 140, and the data channel 262 may correspond to one of the one or more DQ channels 162 shown in FIGS. 1A and 1B. The second input 234 is configured to receive a second reference voltage Vref2 (e.g., a second DC reference voltage).

Figure 3A:
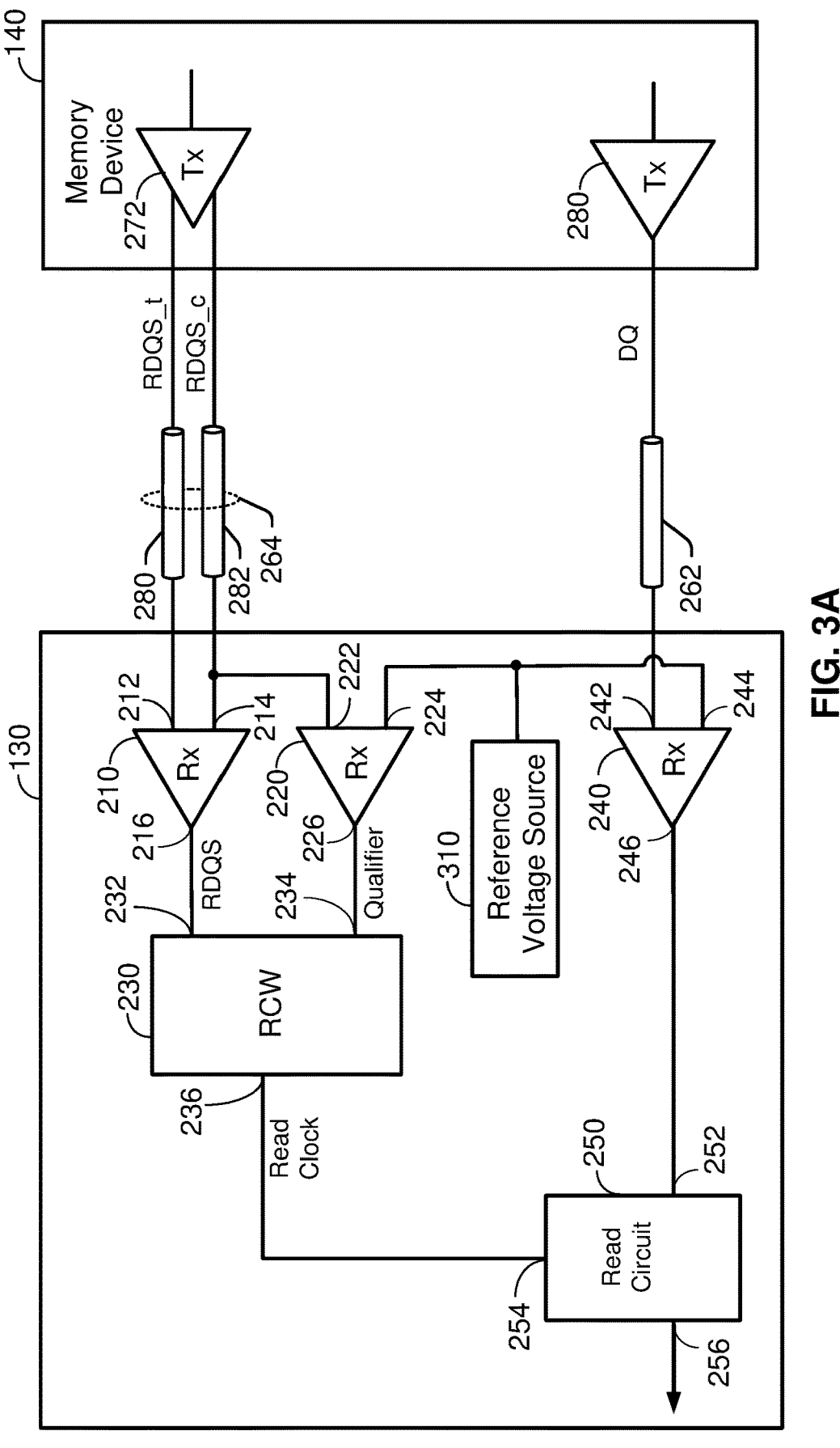
FIG. 3A shows an example of a reference voltage source providing a reference voltage in the memory interface circuit of FIG. 2 according to certain aspects of the present disclosure.
Figure 3B:
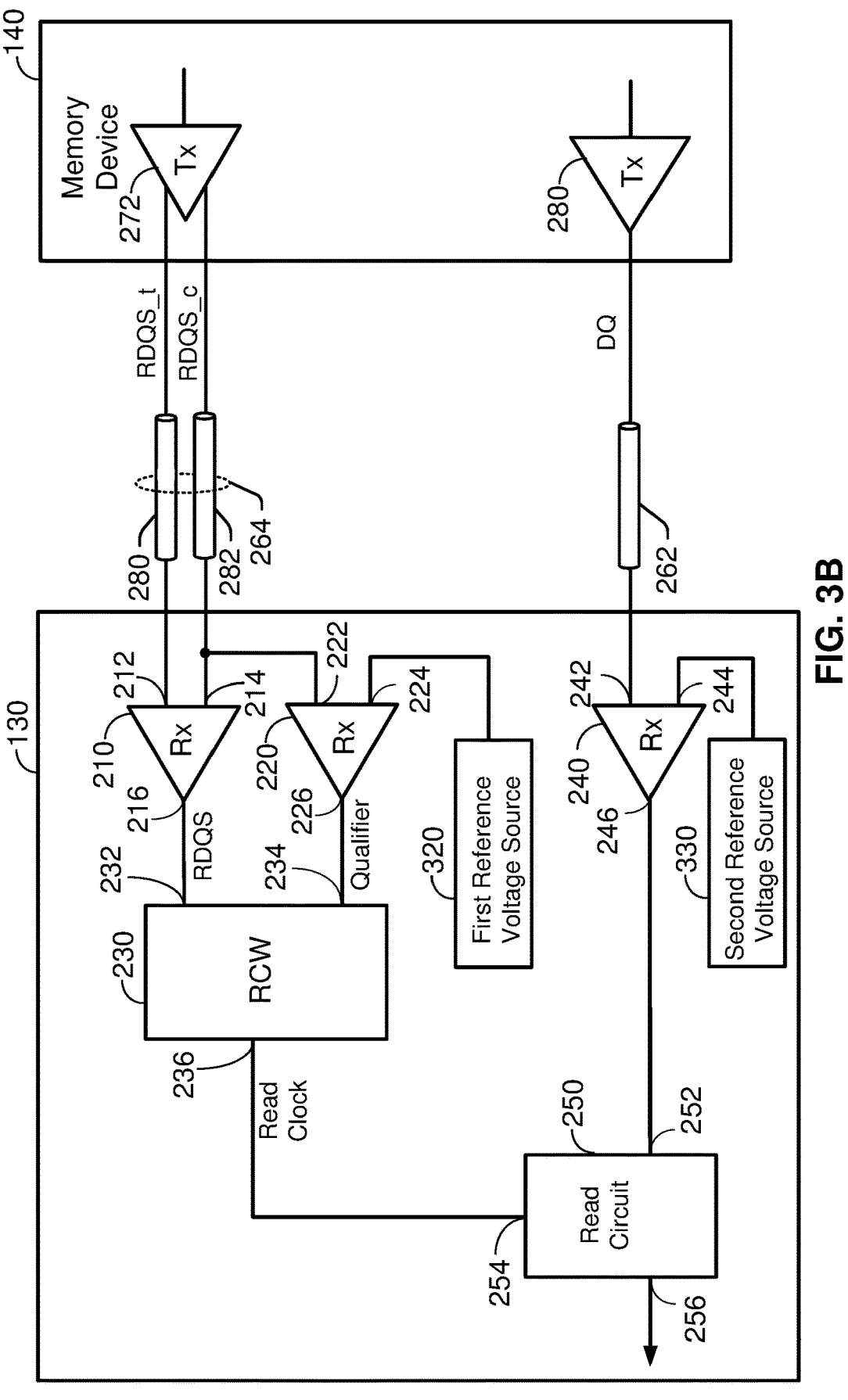
FIG. 3B shows an example of a first reference voltage source providing a first reference voltage and a second reference voltage source providing a second reference voltage in the memory interface circuit of FIG. 2 according to certain aspects of the present disclosure.

The second reference voltage Vref2 may be the same as the first reference voltage Vref1 or different. For the example where the reference voltages Vref1 and Vref2 are the same, the reference voltages Vref1 and Vref2 may be generated by a common reference voltage source 310 coupled to the second input 224 of the second receiver 220 and the second input 244 of the third receiver 240, as shown in FIG. 3A. For the example where the reference voltages Vref1 and Vref2 are different, the first reference voltage Vref1 may be generated by a first reference voltage source 320 coupled to the second input 224 of the second receiver 220, and the second reference voltage Vref2 may be generated by a second reference voltage source 330 coupled to the second input 244 of the third receiver 240, as shown in FIG. 3B. In this example, the first reference voltage Vref1 and the second reference voltage Vref2 may be independently controlled with respect to one another.

In this example, the third receiver 240 is configured to generate an internal read data signal based on the data signal DQ from the memory device 140 and the second reference voltage Vref2, and output the internal read data signal at the output 246. For example, the third receiver 240 may pull the internal read data signal high (i.e., logic one) when the data signal DQ is greater than the second reference voltage Vref2, and pull the internal read data signal low (i.e., logic zero) when the data signal DQ is less than the second reference voltage Vref2. In this example, the third receiver 240 is implemented with a pseudo-differential receiver.

The read circuit 250 has a data input 252, a clock input 254, and an output 256. The data input 252 is coupled to the output 246 of the third receiver 240 to receive the read data signal from the third receiver 240. The clock input 254 is coupled to the output 236 of the RCW circuit 230 to receive the read clock signal from the RCW circuit 230. The output 256 is coupled to the memory controller 120 (shown in FIGS. 1A and 1B). The read circuit 250 is configured to capture (i.e., sample) read data bits from the read data signal based on edges (e.g., rising and falling edges) of the read clock signal, and output the read data bits to the memory controller 120 via the output 256. In other words, the read circuit 250 uses the edges of the read clock signal to time the capture of the read data bits.

Figure 4A:
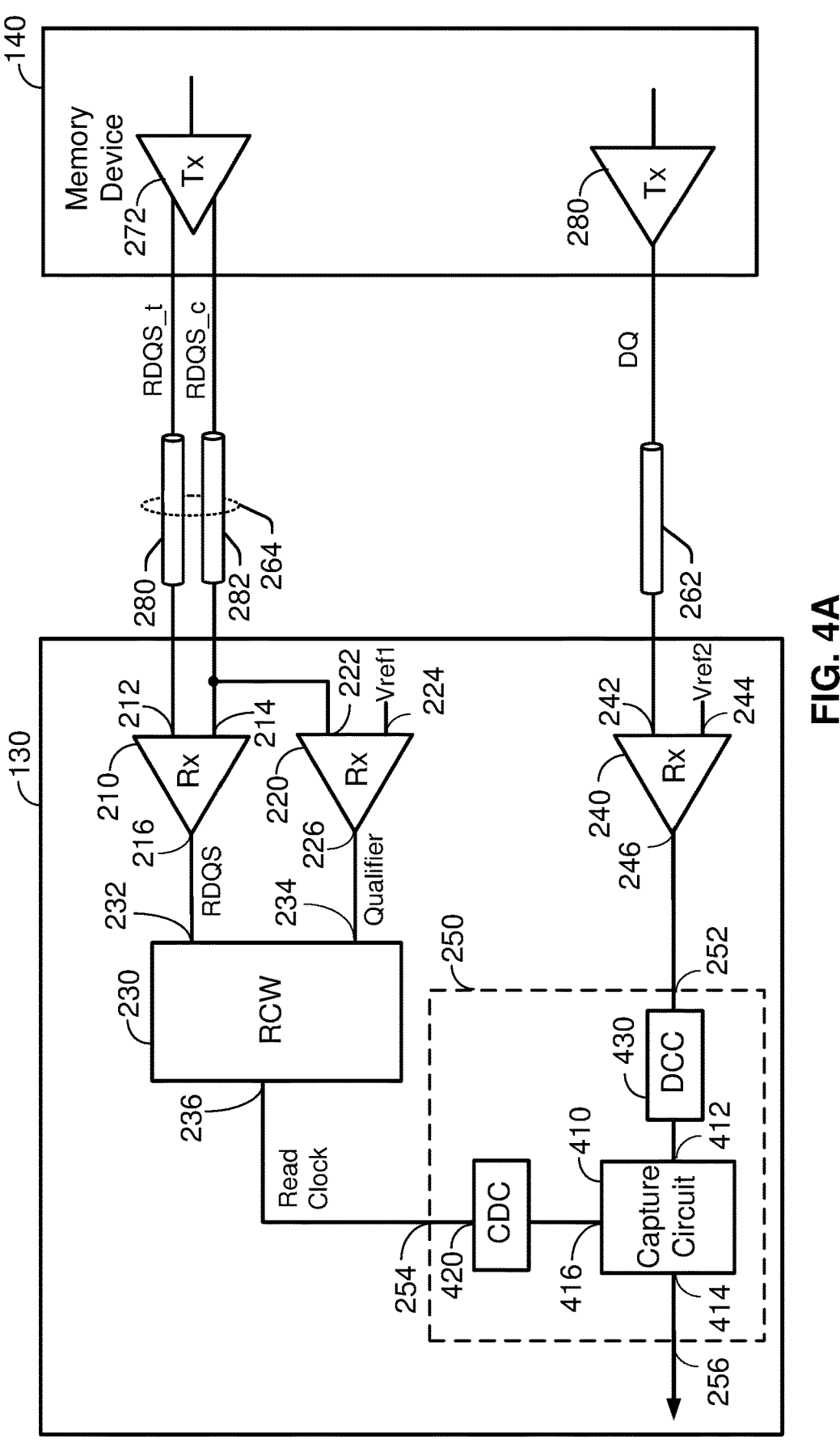
FIG. 4A shows an exemplary implementation of a read circuit according to certain aspects of the present disclosure.

FIG. 4A shows an exemplary implementation of the read circuit 250 according to certain aspects. In the example in FIG. 4A, the read circuit 250 includes a capture circuit 410, a calibrated delay circuit (CDC) 420, and a duty cycle correction (DCC) circuit 430. The capture circuit 410 has a data input 412, a clock input 416, and an output 414. In this example, the DCC circuit 430 is coupled between the output 246 of the third receiver 240 and the data input 412 of the capture circuit 410. The CDC 420 is coupled between the output 236 of the RCW circuit 230 and the clock input 416 of the capture circuit 410. The output of the capture circuit 410 is coupled to the memory controller 120 (shown in FIGS. 1A and 1B). The capture circuit 410 may also be referred to as a data capture circuit.

The DCC circuit 430 may be configured to adjust the duty cycle of the read data signal to a duty cycle (e.g., approximately 50%) that maximizes the time available for sampling each data bit of the data signal. In this example, the read data signal is input to the data input 412 of the capture circuit 410 after the duty-cycle adjustment. The DCC circuit 430 may also be referred to as a duty cycle corrector or another term.

The CDC 420 is configured to adjust the timing between the read clock signal from the RCW circuit 230 and the read data signal input to the capture circuit 410 by delaying the read clock signal by an adjustable time delay. For example, the CDC 420 may be configured to adjust the timing of the read clock signal so that edges (e.g., rising and falling edges) of the read clock signal are located between data bit transitions in the read data signal (e.g., align the edges of the read clock signal in the center of the data eye of the read data signal). In this example, the CDC 420 may delay the edges of the read clock signal such that the edges of the read clock signal and the bit transitions are separated by a quarter of a clock period (¼ T). In this example, the read clock signal is input to the capture circuit 410 after the CDC 420.

Figure 4B:
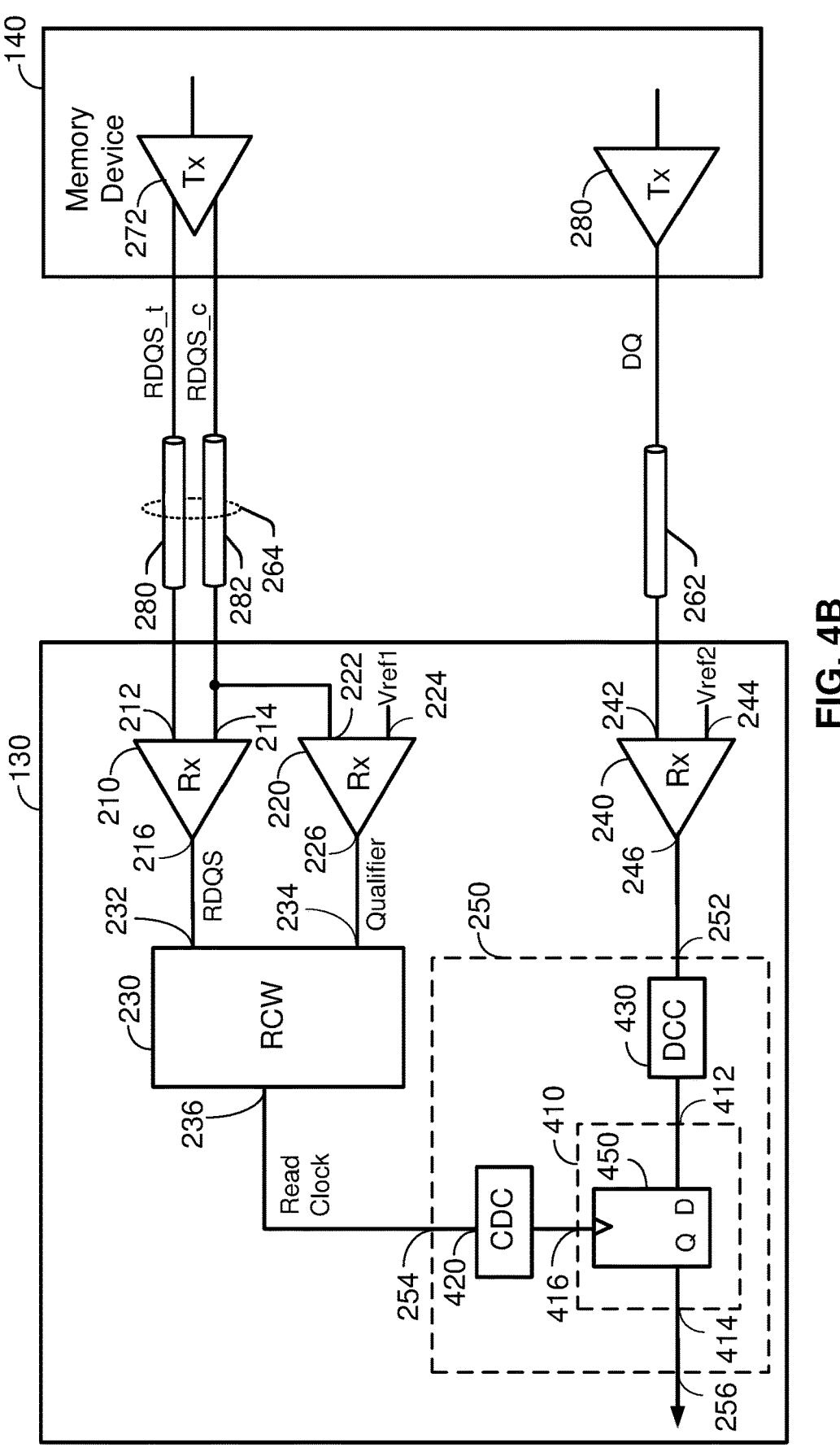
FIG. 4B shows an exemplary implementation of a capture circuit in the read circuit of FIG. 4A according to certain aspects of the present disclosure.

The capture circuit 410 is configured to capture (i.e., sample) data bits from the read data signal on edges (e.g., rising and falling edges) of the read clock signal, and output the data bits to the memory controller 120 (shown in FIGS. 1A and 1B). The memory controller 120 may forward the data bits to the processor 110. In certain aspects, the capture circuit 410 may be implemented with one or more flip-flops that are clocked by the read clock signal. In this regard, FIG. 4B shows an example in which the capture circuit 410 includes a flip-flop 450. In this example, the clock input of the flip-flop 450 is coupled to the clock input 416 to receive the read clock signal, the data input D of the flip-flop 450 is coupled to the data input 412 to receive the read data signal, and the output Q of the flip-flop 450 is coupled to the output 414. In certain aspects, the flip-flop 450 may be a dual-edge triggered flip-flop that captures data bits on both rising and falling edges of the read clock signal. However, it is to be appreciated that the capture circuit 410 is not limited to this example.

Figure 5:
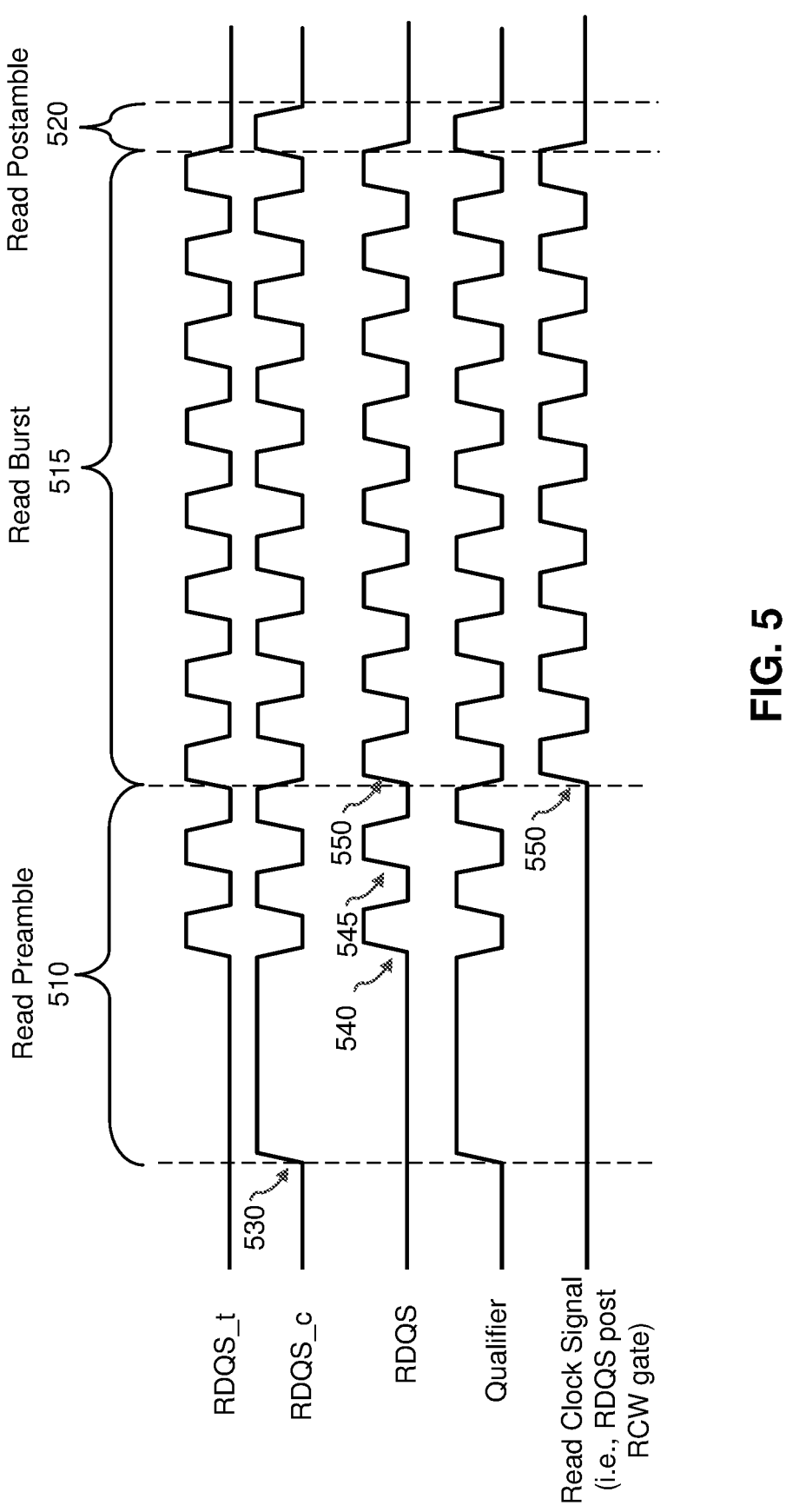
FIG. 5 is a timing diagram showing an example of signals in the memory interface circuit according to certain aspects of the present disclosure.

As discussed above, the RCW circuit 230 is configured to filter out (e.g., gate) a preamble in the data strobe signal RDQS to provide the read clock signal at the output 236 of the RCW circuit 230. An example of the preamble is illustrated in FIG. 5, which is a timing diagram showing an example of the data strobe signals RDQS_t, RDQS_c, and RDQS, an example of the qualifier signal, and an example of the read clock signal. In this example, the data strobe signals RDQS_t, RDQS_c, and RDQS include a preamble 510, a read burst portion 515, and a postamble 520.

The preamble 510 of the strobe signals RDQS_t and RDQS_c precedes the read burst portion 515 and is used to precondition the receivers 210 and 220 to receive the read burst portion 515 of the strobe signals RDQS_t and RDQS_c. The read burst portion 515 of the strobe signal RDQS includes clock pulses corresponding to data bits in the read data signal during a read data burst (e.g., an eight-cycle read burst). The read circuit 250 uses the clock pulses within the read burst portion 515 to capture (i.e., sample) the data bits from the read data signal, as discussed further below. The postamble 520 follows the read burst portion 515 to signal the end of the read data burst.

In the example shown in FIG. 5, the preamble 510 includes a first portion 530 in which the second strobe signal RDQS_c is high for two clock cycles (i.e., periods). The first portion 530 of the preamble 510 is followed by a first preamble pulse 540 and a second preamble pulse 545 in the strobe signal RDQS. Each of the preamble pulses 540 and 545 corresponds to a respective cycle of the strobe signal RDQS. The second preamble pulse 545 is followed by the first clock pulse 550 in the read burst portion 515 used to capture valid data from the read data signal.

In this example, the RCW circuit 230 filters out the preamble 510 from the strobe signal RDQS to provide the read clock signal. For example, the RCW circuit 230 may filter out the preamble 510 by gating the first and second preamble pulses 540 and 545 in the preamble 510 of the strobe signal RDQS and passing the clock pulses in the read burst portion 515 of the strobe signal RDQS. Thus, in this example, the read clock signal corresponds to the strobe signal RDQS after the gating of the preamble 510 (i.e., the RDQS signal post RCW gate).

In certain aspects, the preamble pulses 540 and 545 in the preamble 510 may be more susceptible to inter-symbol interface (ISI) due to high-frequency attenuation in the data strobe channel 264 than the clock pulses in the read burst portion 515. This is because the first few pulses after the data strobe channel 264 wakes up from an idle state may be more susceptible to ISI. In these aspects, the preamble pulses 540 and 545 may be unsuitable for data capture due to the ISI, and need to be filtered out by the RCW circuit 230.

It is to be appreciated that the preamble 510 is not limited to the example shown in FIG. 5. For example, in other examples, the preamble 510 in the strobe signal RDQS may include a single preamble pulse, three preamble pulses, or four preamble pulses preceding the read burst portion 515.

Figure 6:
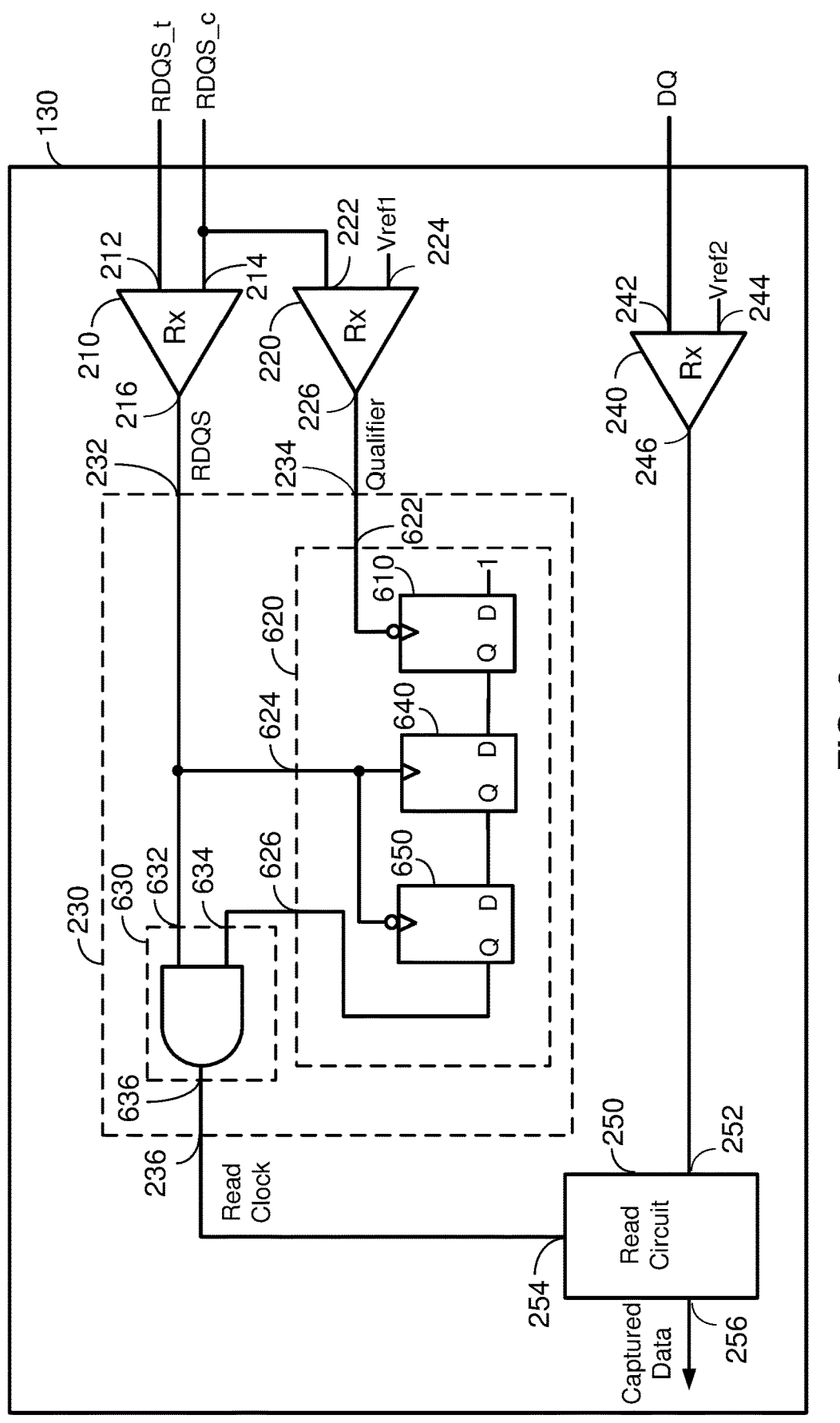
FIG. 6 shows an exemplary implementation of a read capture window (RCW) circuit according to certain aspects of the present disclosure.

FIG. 6 shows an exemplary implementation of the RCW circuit 230 according to certain aspects. In this example, the RCW circuit 230 is configured to filter out the exemplary preamble 510 shown in FIG. 5. However, it is to be appreciated that the RCW circuit 230 is not limited to this example, as discussed further below.

In this example, the RCW circuit 230 includes a gating circuit 630 and a gate control circuit 620. The gating circuit 630 has a first input 632, a second input 634, and an output 636. The first input 632 is coupled to the first input 232 of the RCW circuit 230 to receive the strobe signal RDQS from the first receiver 210, and the second input 634 is configured to receive a gate control signal from the gate control circuit 620. The output 636 is coupled to the output 236 of the RCW circuit 230, which is coupled to the read circuit 250.

The gating circuit 630 is configured to gate the strobe signal RDQS or pass the strobe signal RDQS to the output 636 based on the gate control signal. For example, the gating circuit 630 may gate the strobe signal RDQS when the gate control signal at the second input 634 has a first logic value and pass the strobe signal RDQS to the output 636 when the gate control signal at the second input 634 has a second logic value. The first logic value may be logic zero and the second logic value may be logic one, or vice versa. The second input 634 of the gating circuit 630 may also be referred to as the control input.

FIG. 6 shows an example in which the gating circuit 630 is implemented with an AND gate that gates the strobe signal RDQS when the gate control signal is logic zero and passes the strobe signal RDQS to the output 636 when the gate control signal is logic one. However, it is to be appreciated that the gating circuit 630 is not limited to an AND gate, and that the gating circuit 630 may be implemented with another type of logic gate, combinational logic, a multiplexer, one or more switches, or any combination thereof. As discussed further below, the gate control circuit 620 causes the gating circuit 630 to gate the preamble 510 of the strobe signal RDQS and pass the read burst portion 515 of the strobe signal RDQS to provide the read clock signal at the output 236 of the RCW circuit 230. In this example, the output 236 of the RCW circuit 230 is low when the strobe signal RDQS is gated.

In this example, the gate control circuit 620 has a first input 622, a second input 624, and an output 626. The first input 622 is coupled to the output 226 of the second receiver 220 to receive the qualifier signal, the second input 624 is coupled to the first input 232 of the RCW circuit 230 to receive the strobe signal RDQS, and the output 626 is coupled to the second input 634 (i.e., the control input) of the gating circuit 630. The gate control circuit 620 may include logic (e.g., flip-flops) clocked by rising edges and/or falling edges of the strobe signal RDQS and the qualifier signal.

In the example shown in FIG. 6, the gate control circuit 620 includes a qualifier flip-flop 610, a first strobe flip-flop 640, and a second strobe flip-flop 650. As used herein, a qualifier flip-flop is clocked by the qualifier signal and a strobe flip-flop is clocked by the strobe signal RDQS.

In this example, the qualifier flip-flop 610 has a clock input coupled to the first input 622 of the gate control circuit 620 to receive the qualifier signal, a signal input D coupled to a logic value (e.g., logic one), and an output Q. The qualifier flip-flop 610 is configured to latch the logic value (e.g., logic one) at the input D on a falling edge of the qualifier signal, and output the latched logic value at the output Q. In other words, the qualifier flip-flop 610 is configured to propagate the logic value (e.g., logic one) to the output Q on the falling edge of the qualifier signal.

The first strobe flip-flop 640 has a clock input coupled to the second input 624 of the gate control circuit 620 to receive the strobe signal RDQS, and a signal input D coupled to the output Q of the qualifier flip-flop 610. The first strobe flip-flop also has an output Q. The first strobe flip-flop 640 is configured to latch the logic value at the input D on a rising edge of the strobe signal RDQS, and output the latched logic value at the output Q.

The second strobe flip-flop 650 has a clock input coupled to the second input 624 of the gate control circuit 620 to receive the strobe signal RDQS, and a signal input D coupled to the output Q of the first strobe flip-flop 640. The second strobe flip-flop 650 also has an output Q coupled to the second input 634 (i.e., the control input) of the gating circuit 630. The second strobe flip-flop 650 is configured to latch the logic value at the input D on a falling edge of the strobe signal RDQS, and output the latched logic value at the output Q.

Figure 7:
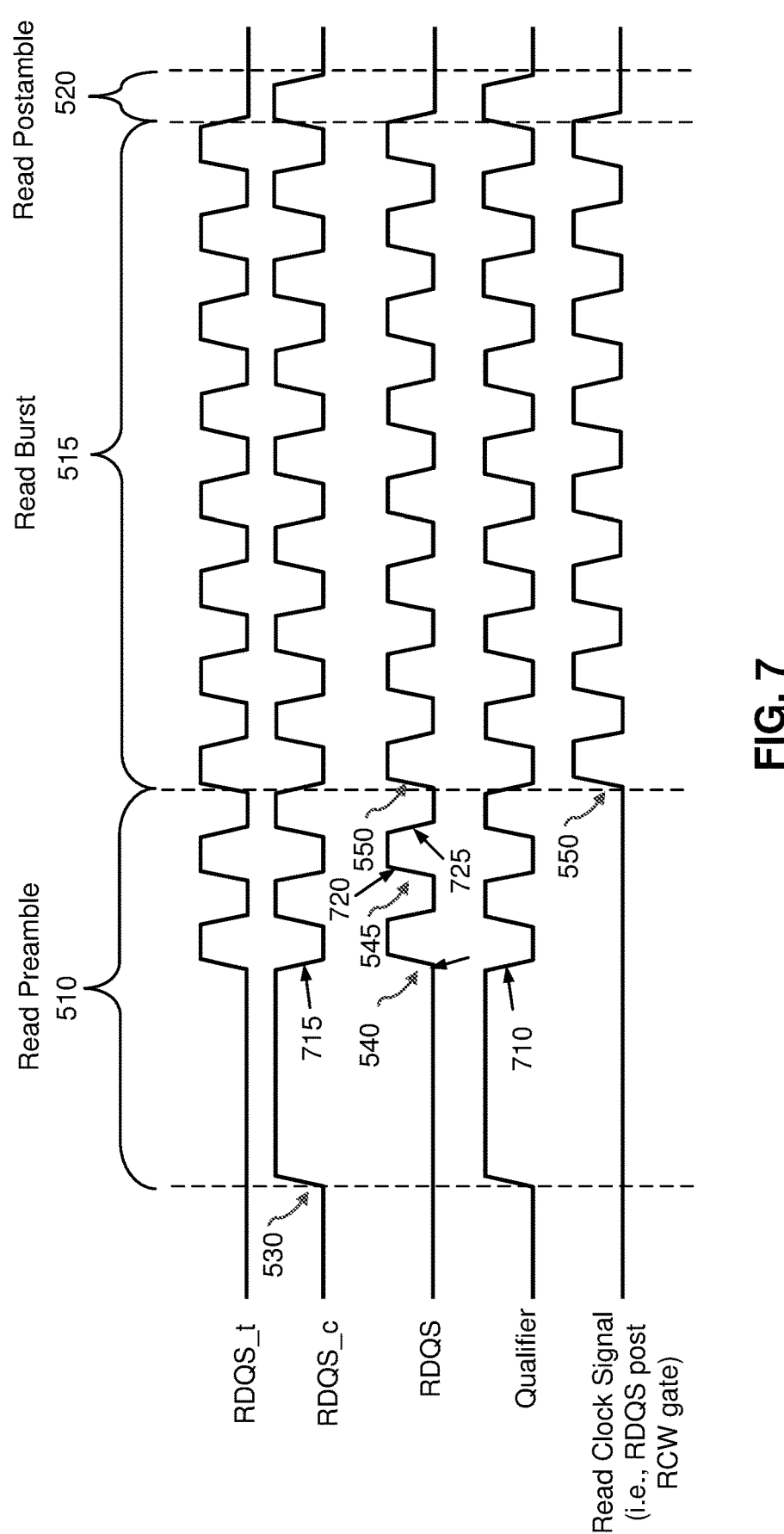
FIG. 7 is a timing diagram illustrating exemplary signals in the RCW circuit of FIG. 6 according to certain aspects of the present disclosure.

Exemplary operations of the RCW circuit 230 will now be described with reference to FIG. 7 according to certain aspects. In this example, it is assumed that the flip-flops 610, 640, and 650 are reset prior to the preamble 510 and the gate control signal is initially zero, which causes the gating circuit 630 in this example to gate the strobe signal RDQS. In this example, the qualifier flip-flop 610 propagates the logic one at the input D of the qualifier flip-flop 610 to the first strobe flip-flop 640 on a falling edge 710 of the qualifier signal, which correspond to the falling edge 715 of the first portion 530 of the preamble 510.

The first strobe flip-flop 640 propagates the logic one from the qualifier flip-flop 610 to the second strobe flip-flop 650 on the rising edge 720 of the second preamble pulse 545 in the preamble 510. The second strobe flip-flop 650 then propagates the logic one from the first strobe flip-flop 640 to the second input 634 of the gating circuit 630 on the falling edge 725 of the second preamble pulse 545 in the preamble 510. The logic one at the second input 634 of the gating circuit 630 causes the gating circuit 630 to un-gate (i.e., pass) the strobe signal RDQS in this example. Thus, in this example, the gate control circuit 620 causes the gating circuit 630 to un-gate the strobe signal RDQS after the last preamble pulse (i.e., second preamble pulse 545) in the preamble 510. As a result, the gating circuit 630 gates the preamble 510 of the strobe signal RDQS and passes the read burst portion 515 following the preamble 510 to provide the read clock signal. The flip-flops 610, 640, and 650 may be reset before the next read cycle to prepare the flip-flops 610, 640, and 650 for the next read cycle.

Figure 8:
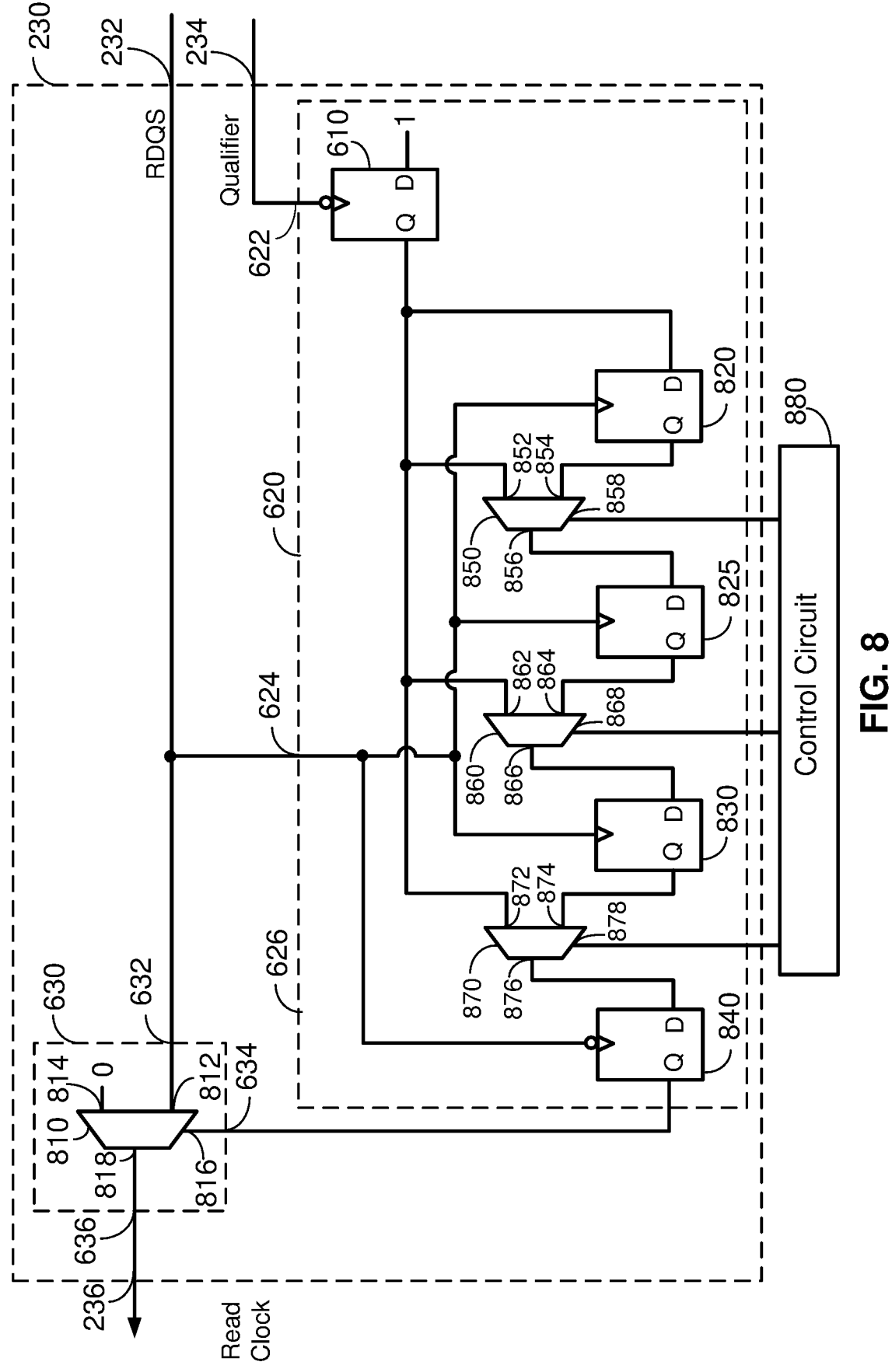
FIG. 8 shows another exemplary implementation of an RCW circuit according to certain aspects of the present disclosure.

It is to be appreciated that the RCW circuit 230 is not limited to a preamble 510 with two preamble pulses (e.g., pulses 540 and 545). In this regard, FIG. 8 shows an example in which the gate control circuit 620 can be programmed to gate preambles with different numbers of preamble pulses according to certain aspects.

In this example, the gate control circuit 620 includes the qualifier flip-flop 610, a first strobe flip-flop 820, a second strobe flip-flop 825, a third strobe flip-flop 830, and a fourth strobe flip-flop 840. The clock inputs of the flip-flops 820, 825, 830, and 835 are coupled to the second input 624 of the gate control circuit 620 to receive the strobe signal RDQS.

In this example, each of the flip-flops 820, 825, and 830 is rising-edge triggered (i.e., positive-edge triggered) and the fourth strobe flip-flop 840 is falling-edge triggered (i.e., negative-edge triggered). The input D of the first strobe flip-flop 820 is coupled to the output Q of the qualifier flip-flop 610.

The gate control circuit 620 also includes a first multiplexer 850, a second multiplexer 860, and a third multiplexer 870. The first multiplexer 850 has a first input 852 coupled to the output Q of the qualifier flip-flop 610, a second input 854 coupled to the output Q of the first strobe flip-flop 820, an output 856 coupled to the input D of the second strobe flip-flop 825, and a select input 858. The second multiplexer 860 has a first input 862 coupled to the output Q of the qualifier flip-flop 610, a second input 864 coupled to the output Q of the second strobe flip-flop 825, an output 866 coupled to the input D of the third strobe flip-flop 830, and a select input 868. The third multiplexer 870 has a first input 872 coupled to the output Q of the qualifier flip-flop 610, a second input 874 coupled to the output Q of the third strobe flip-flop 830, an output 876 coupled to the input D of the fourth strobe flip-flop 840, and a select input 878.

In this example, the select inputs 858, 868, and 878 are coupled to a control circuit 880. The control circuit 880 is configured to program the gate control circuit 620 by controlling the selections of the multiplexers 850, 860, and 870. For example, to program the gate control circuit 620 to gate a preamble with a single preamble pulse, the control circuit 880 may cause the third multiplexer 870 to select the first input 872. In this example, the gate control signal bypasses the flip-flops 820, 825, and 830. To program the gate control circuit 620 to gate a preamble with two preamble pulses (e.g., preamble pulses 540 and 545), the control circuit 880 may cause the third multiplexer 870 to select the second input 874 and the second multiplexer 860 to select the first input 862. In this example, the gate control signal bypasses the flip-flops 820 and 825. Also, in this example, the third strobe flip-flop 830 may correspond to the first strobe flip-flop 640 in the example in FIG. 6. To program the gate control circuit 620 to gate a preamble with three preamble pulses, the control circuit 880 may cause the third multiplexer 870 to select the second input 874, the second multiplexer 860 to select the second input 864, and the first multiplexer 850 to select the first input 852. In this example, the gate control signal bypasses the first strobe flip-flop 820. To program the gate control circuit 620 to gate a preamble with four preamble pulses, the control circuit 880 may cause the third multiplexer 870 to select the second input 874, the second multiplexer 860 to select the second input 864, and the first multiplexer 850 to select the second input 854. In this example, the gate control signal propagates through all of the flip-flops 820, 825, 830, and 835.

FIG. 8 shows an example in which the gating circuit 630 is implemented with a multiplexer 810 having a first input 812 coupled to the first input 632 of the gating circuit 630 to receive the strobe signal RDQS, a second input 814 coupled to logic zero (e.g., ground potential), a select input 816 coupled to the second input 634 of the gating circuit 630 to receive the gate control signal, and an output 818 coupled to the output 636 of the gating circuit 630. In this example, the gate control signal from the gate control circuit 620 controls whether the gating circuit 630 gates the strobe signal RDQS by controlling whether the multiplexer 810 select the first input 812 or the second input 814. More particularly, the gate control signal causes the multiplexer 810 to select the second input 814 to gate the strobe signal RDQS, and causes the multiplexer 810 to select the first input 812 to pass the strobe signal RDQS. In this example, the output 236 of the RCW circuit 230 is low (i.e., logic zero) when the strobe signal RDQS is gated.

In certain aspects, the memory device 140 may select the number of preamble pulses in the preamble based on the data rate and the frequency of the strobe signals RDQS_t and RDWS_c. For example, the memory device 140 may select a larger number of preamble pulses for a higher frequency (e.g., due to higher ISI at higher frequency) and select a smaller number of preamble pulses for a lower frequency. In this example, the control circuit 880 may program the number of preamble pulses filtered out by the RCW circuit 230 based on the number of preamble pulses selected by the memory device 140.

It is to be appreciated that the RCW circuit 230 is not limited to the exemplary implementations shown in FIGS. 6 and 8. For example, in other implementations, the qualifier flip-flop 610 may be triggered by a rising edge of the qualifier signal and/or the gate control circuit 620 may include a different number of flip-flops than shown in the examples in FIGS. 6 and 8. In other implementations, the gating circuit 630 may be configured to gate the strobe signal RDQS when the gate control signal is high and pass the gate strobe signal RDQS when the gate control signal is low. In this example, the gate control circuit 620 may include a logic gate that inverts the gate control signal before the gate control signal is input to the gating circuit 630. Alternately or in addition, a logic zero may be input to the qualifier flip-flop 610 instead of a logic one, in which the flip-flops 610, 820, 825, 830, and 840 are set before the preamble. It is also to be appreciated that the gate control circuit 620 may include additional components (e.g., logic gates) in addition to the components shown in FIGS. 6 and 8.

Figure 9:
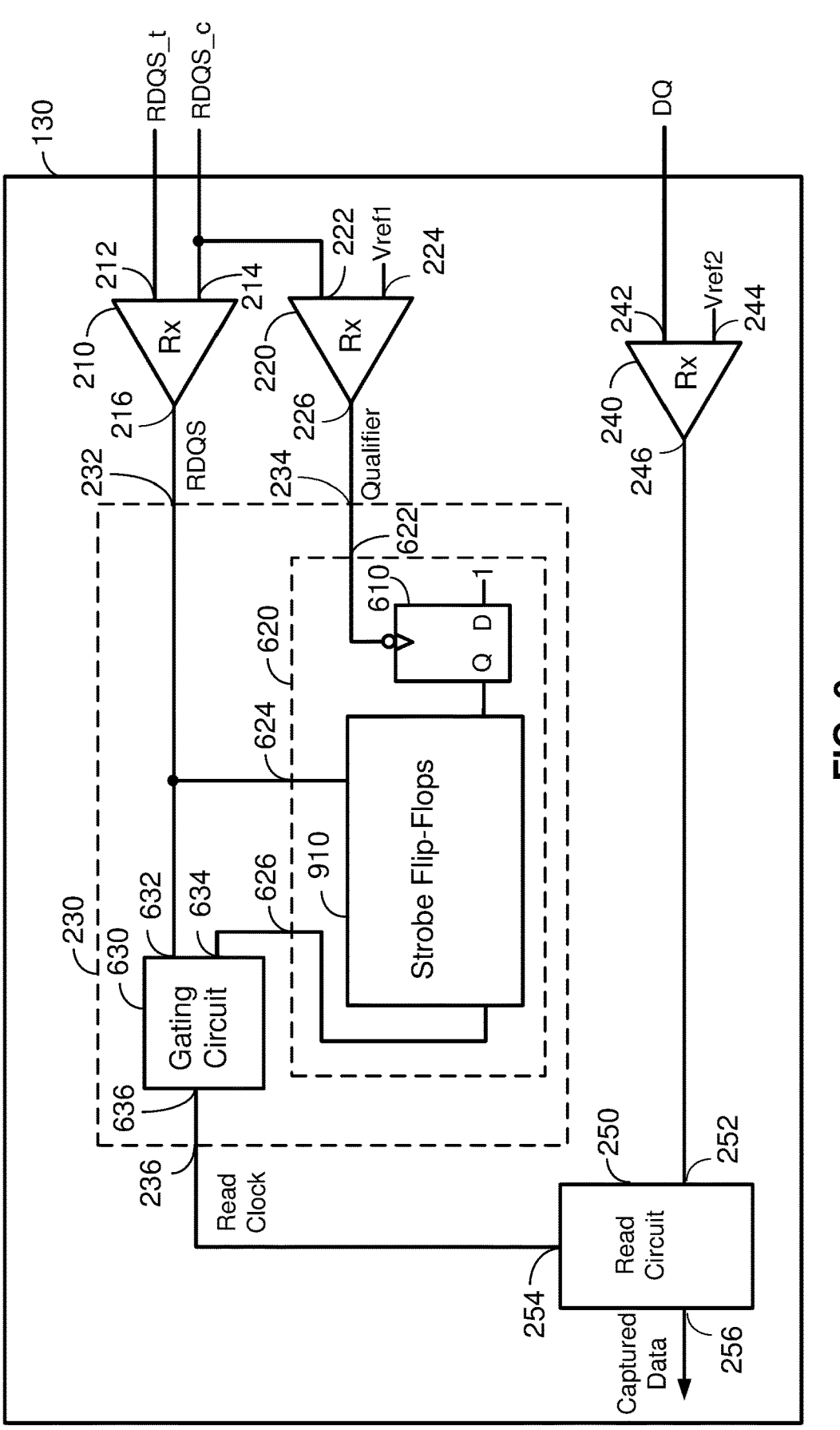
FIG. 9 shows an exemplary implementation of a gate control circuit according to certain aspects of the present disclosure.

It is also to be appreciated that the gate control circuit 620 is not limited to the exemplary strobe flip-flops shown in FIGS. 6 and 8. In general, the gate control circuit 620 may include one or more strobe flip-flops 910 coupled in series between the output Q of the qualifier flip-flop 610 and the output 626 of the gate control circuit 620 wherein the strobe flip-flops are clocked by the strobe signal RDQS, as shown in FIG. 9. In this example, the gate control signal propagates from the output Q of the qualifier flip-flop 610 to the output 626 of the gate control circuit 620 through the strobe flip-flops. In the example shown in FIG. 6, the one or more strobe flip-flops 910 include the strobe flip-flops 640 and 650. In the example shown in FIG. 8, the one or more strobe flip-flops 910 may include one or more of the strobe flip-flops 820, 825, 830, and 840 (e.g., depending on the number of preamble pulses that are programed). It is to be appreciated that one or more logic gates and/or one or more multiplexers may be coupled between the strobe flip-flops.

The qualifier flip-flop 610 and the first strobe flip-flop (e.g., the first strobe flip-flop 640 in FIG. 6) coupled to the output Q of the qualifier flip-flop 610 may need to meet tight timing requirements (e.g., setup/hold time requirements) in order for the gate control circuit 620 to properly gate the preamble of the strobe signal RDQS. The ability of the qualifier flip-flop 610 and the first strobe flip-flop (e.g., the first strobe flip-flop 640) to meet the timing requirements is sensitive to the skew between the strobe signal RDQS and the qualifier signal (e.g., the skew between the edge (e.g., rising edge) of the strobe signal RDQS triggering the first strobe flip-flop and the edge (e.g., falling edge) of the qualifier signal triggering the qualifier flip-flop 610). A violation of the timing requirements (e.g., a setup time violation and/or a hold time violation) can cause the gate control circuit 620 to gate only a portion of the preamble, which can lead to the capture of invalid data. For example, a hold time violation in the first strobe flip-flop (e.g., the first strobe flip-flop 640) may cause the RCW circuit 230 to pass the second preamble pulse 545 in the preamble 510 (sometimes referred to as a cycle-slip failure), which causes the read circuit 250 to capture invalid data on the edges of the second preamble pulse 545.

Also, as discussed above, the preamble pulses in the strobe signal RDQS and the qualifier signal may be susceptible to ISI due to high-frequency attenuation in the data strobe channel 264. The ISI degrades the timing of the RCW circuit 230, making it more challenging to meet the timing requirements.

To address the above, aspects of the present disclosure provide one or more circuits for adjusting the skew between the strobe signal RDQS and the qualifier signal to meet timing requirements (e.g., setup/hold time requirements) in the RCW circuit 230. The one or more circuits may include a control circuit for independently adjusting the delays of the first receiver 210 and the second receiver 220 and/or a delay adjuster for adjusting the rise time and/or fall time of the qualifier signal. The above features and other features of the present disclosure are discussed further below.

Figure 10:
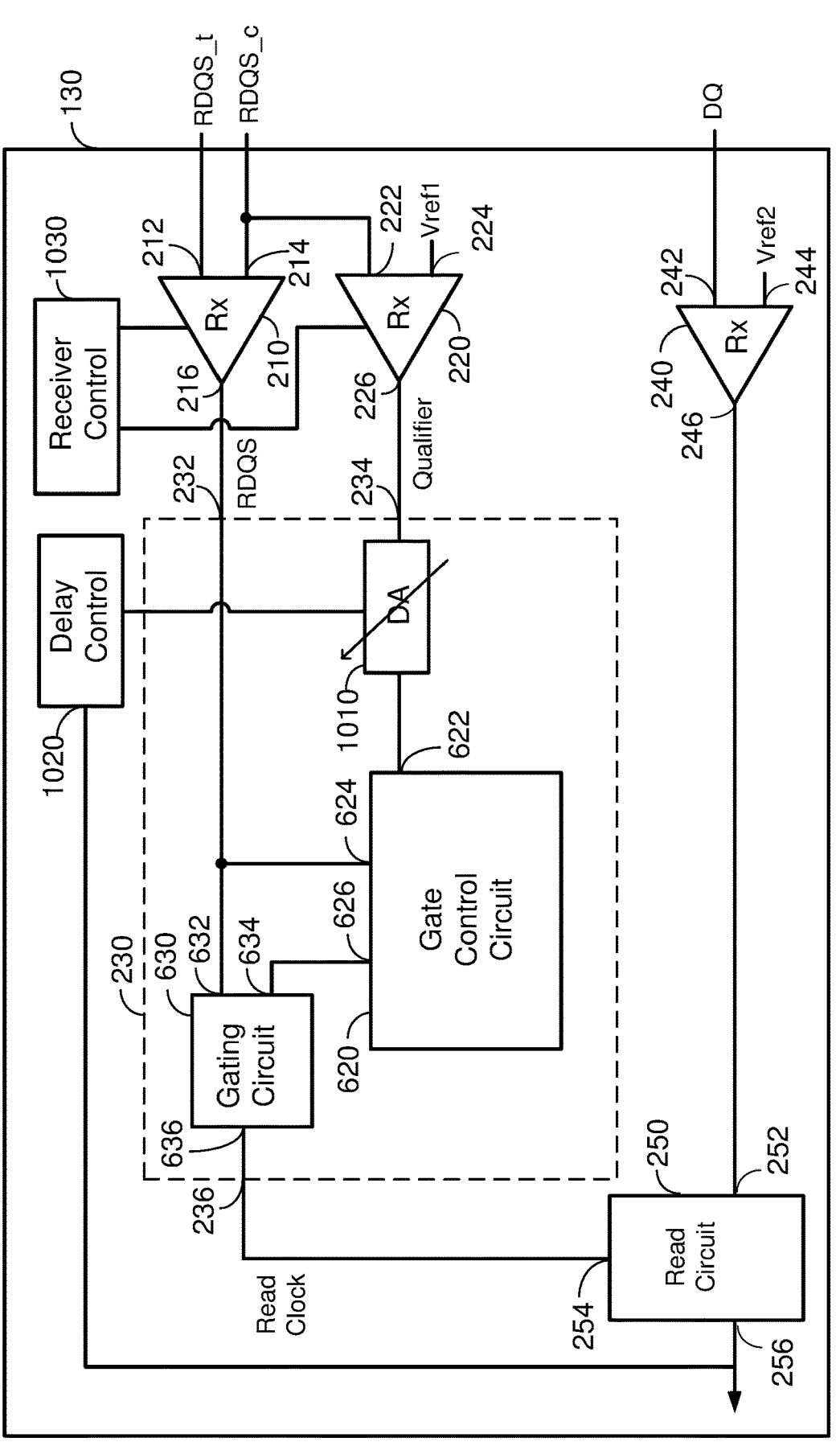
FIG. 10 shows an example in which the memory interface circuit includes a delay adjuster in the RCW circuit and a receiver control circuit according to certain aspects of the present disclosure.

FIG. 10 shows an example of the memory interface circuit 130 according to certain aspects of the present disclosure. In this example, the RCW circuit 230 includes a delay adjuster (DA) 1010 coupled between the output 226 of the second receiver 220 and the first input 622 of the gate control circuit 620, which is coupled to the clock input of the qualifier flip-flop 610 (shown in FIGS. 6 and 8). The DA 1010 is configured to adjust (i.e., tune) the rise time and/or the fall time of the qualifier signal at the clock input of the qualifier flip-flop 610. This adjusts the skew between the qualifier signal and the strobe signal RDQS, as discussed further below. A delay adjuster may also be referred to as a tunable delay circuit, a tunable delay line, or another term.

In certain aspects, the DA 1010 adjusts the rise time of the qualifier signal by delaying a rising edge of the qualifier signal by a rise time delay, and adjusts the fall time of the qualifier signal by delaying a falling edge of the qualifier signal by a fall time delay. The rise time delay may be tunable to adjust (i.e., tune) the rise time of the qualifier signal at the clock input of the qualifier flip-flop 610, and the fall time delay may be tunable to adjust (i.e., tune) the fall time of the qualifier signal at the clock input of the qualifier flip-flop 610. In certain aspects, the rise time delay and the fall time delay may be independently tuned to independently adjust the fall time and the rise time of the qualifier signal. In this example, the DA 1010 adjusts the duty cycle of the qualifier signal when the rise time delay and the fall time delay of the DA 1010 are different. For example, the DA 1010 increases the duty cycle of the qualifier signal when the fall time delay is greater than the rise time delay, and decreases the duty cycle of the qualifier signal when the rise time delay is greater than the fall time delay. As used herein, a "duty cycle" may refer to the portion of a period of the qualifier signal that the qualifier signal is high (i.e., logic one).

In the example in FIG. 10, the memory interface circuit 130 includes a delay control circuit 1020 coupled to the DA 1010. The delay control circuit 1020 is configured to set the rise time delay and the fall time delay of the DA 1010. For example, the rise time delay may be set by a rise code that is input to the DA 1010 by the delay control circuit 1020, and the fall time delay may be set by a fall code that is input to the DA 1010 by the delay control circuit 1020, where each of the codes may be a respective digital code. In this example, the delay control circuit 1020 may adjust the rise time delay of the DA 1010 (i.e., rise time of the qualifier signal) by changing the rise code input to the DA 1010. The delay control circuit 1020 may also adjust the fall time delay of the DA 1010 (i.e., fall time of the qualifier signal) by changing the fall code input to the DA 1010.

In this example, the memory interface circuit 130 also includes a receiver control circuit 1030 configured to adjust the delay of the first receiver 210 and/or adjust the delay of the second receiver 220. For example, the receiver control circuit 1030 may adjust the delay of the first receiver 210 by adjusting a bias current of the first receiver 210 and/or adjust the delay of the second receiver 220 by adjusting a bias current of the second receiver 220, as discussed further below. In certain aspects, the receiver control circuit 1030 may independently control the delay of the first receiver 210 and the delay of the second receiver 220. This allows the receiver control circuit 1030 to set the delay of the first receiver 210 and the delay of the second receiver 220 to different delays. The different delays may be used to adjust the skew between the strobe signal RDQS output by the first receiver 210 and the qualifier signal output by the second receiver 220, as discussed further below.

Figures 11A, 11B:
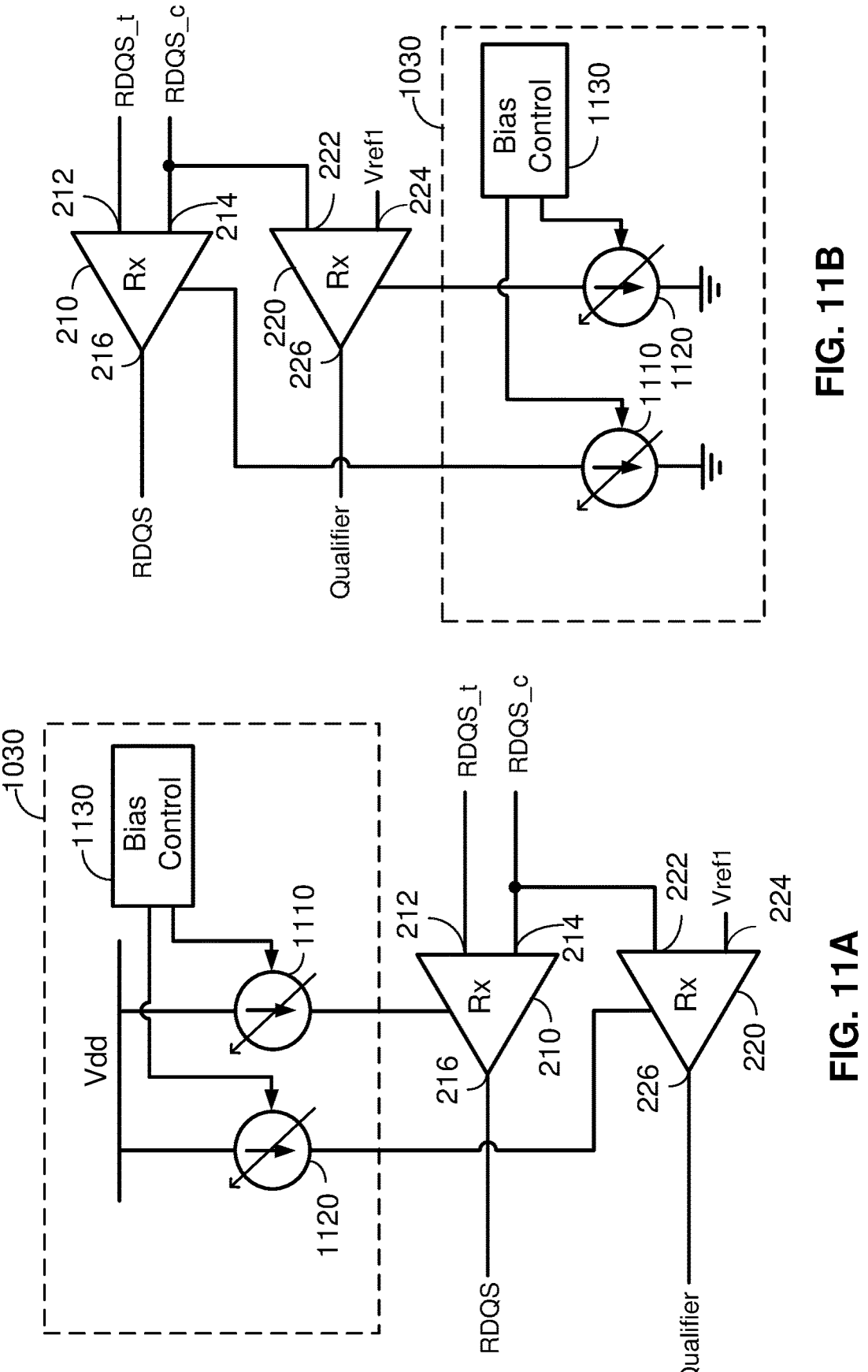
FIG. 11A shows an exemplary implementation of the receiver control circuit according to certain aspects of the present disclosure.
FIG. 11B shows another exemplary implementation of the receiver control circuit according to certain aspects of the present disclosure.

FIG. 11A shows an exemplary implementation of the receiver control circuit 1030 according to certain aspects. In this example, the receiver control circuit 1030 includes a first bias current source 1110, a second bias current source 1120, and a bias control circuit 1130. In this example, the first bias current source 1110 is coupled to the first receiver 210 to provide the first receiver 210 with a first bias current (e.g., first DC bias current), and the second bias current source 1120 is coupled to the second receiver 220 to provide the second receiver 220 with a second bias current (e.g., second DC bias current).

In certain aspects, the first bias current source 1110 is tunable, in which the first bias current is set by a first bias code (e.g., first digital code) from the bias control circuit 1130. Also, the second bias current source 1120 is tunable, in which the second bias current is set by a second bias code (e.g., second digital code) from the bias control circuit 1130. In this example, the bias control circuit 1130 may set the delay of the first receiver 210 and the delay of the second receiver 220 to different delays by setting the first bias current and the second bias current to different current levels. For example, the bias control circuit 1130 may set the second receiver 220 to a shorter delay than the first receiver 210 by setting the second bias current to a higher current level than the first bias current. In this example, the delay of the qualifier signal output by the second receiver 220 is shorter than the delay of the strobe signal RDQS output by the first receiver 210.

In the example shown in FIG. 11A, the first bias current source 1110 is coupled between a supply rail Vdd and the first receiver 210, and the second bias current source 1120 is coupled between the supply rail Vdd and the second receiver 220. In this example, each of the receivers 210 and 220 may include input p-type field effect transistors (not shown). However, it is to be appreciated that the present disclosure is not limited to this example. For example, FIG. 11B shows another implementation in which the first bias current source 1110 is coupled between the first receiver 210 and a ground, and the second bias current source 1120 is coupled between the second receiver 220 and the ground. In this example, each of the receivers 210 and 220 may include input n-type field effect transistors (not shown).

Thus, in this example, the skew between the strobe signal RDQS and the qualifier signal in the RCW circuit 230 may be adjusted using the DA 1010 and/or the receiver control circuit 1030. For example, the skew between the strobe signal RDQS and the qualifier signal may be adjusted to meet timing requirements (e.g., setup/hold time requirements) in the RCW circuit 230 (e.g., to avoid a cycle-slip failure and/or another type of failure).

Figure 12:
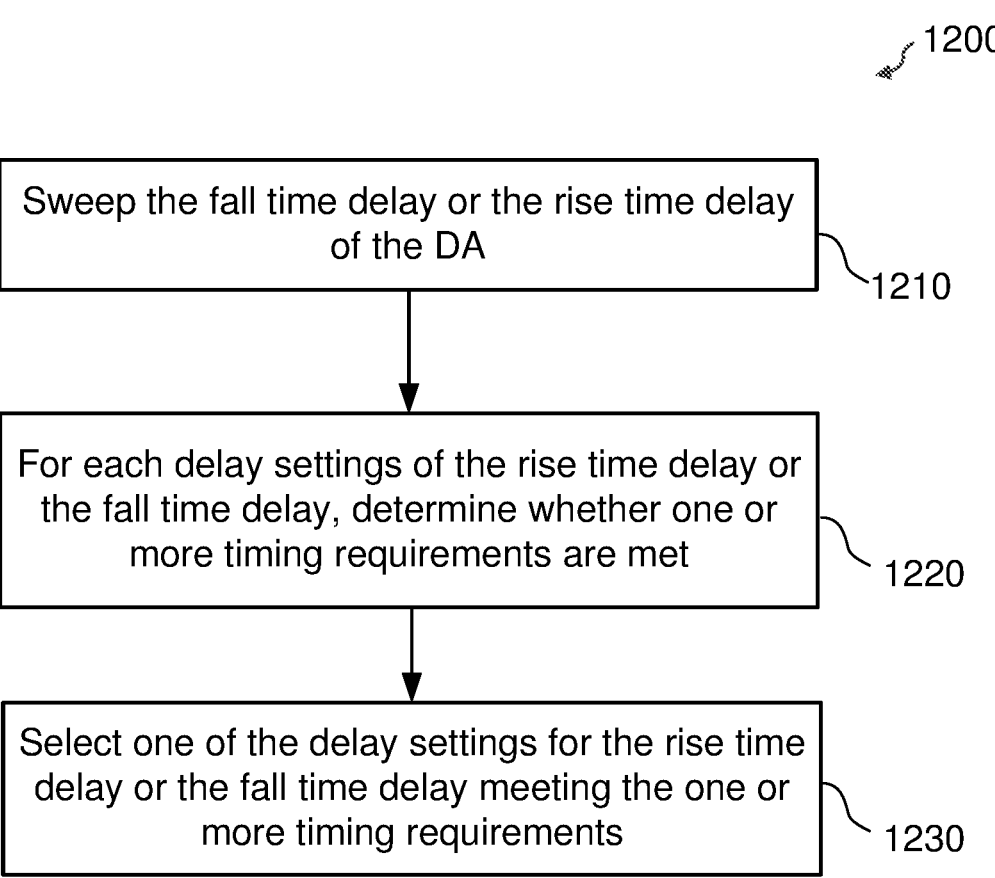
FIG. 12 is a flowchart illustrating an exemplary training method for the delay adjuster according to certain aspects of the present disclosure.

FIG. 12 shows an exemplary training method 1200 for the DA 1010 according to certain aspects. In this example, the receiver control circuit 1030 may set the delay of the second receiver 220 to a shorter delay than the first receiver 210 before the training. For example, the bias control circuit 1130 may set the second bias current to a higher current level than the first bias current to speed up the second receiver 220 with respect to the first receiver 210.

At block 1210, the delay control circuit 1020 sweeps the fall time delay or the rise time delay of the DA 1010 to different delay settings. For example, the delay control circuit 1020 may sweep the fall time delay to different delay settings by sweeping the fall code that controls the fall time delay or sweep the rise time delay to different delay settings by sweeping the rise code that controls the rise time delay. Sweeping the fall time delay may include sequentially setting the fall time delay to each of the delay settings, and sweeping the rise time delay may include sequentially setting the rise time delay to each of the delay settings.

At block 1220, for each delay setting of the rise time delay or the fall time delay, the delay control circuit 1020 determines whether one or more timing requirements (e.g., setup/hold time requirements) in the RCW circuit 230 are met. For example, for each delay setting of the rise time delay or the fall time delay, the third receiver 240 and the read circuit 250 may receive one or more read data bursts from the memory device 140 where each read data burst includes a known sequence of data bits. In this example, the read circuit 250 captures the one or more read data bursts using the read clock signal, and compares the data bits in each of the captured one or more read data bursts with the known (i.e., expected) sequence of data bits for the read data burst. In this example, the delay control circuit 1020 may determine that the one or more timing requirements are met when the data bits in each of the captured one or more read data bursts matches the known (i.e., expected) sequence of data bits for the read data burst. The delay control circuit 1020 may determine that the one or more timing requirements are not met when there is a mismatch between the data bits in at least one of the captured one or more read data bursts and the known (i.e., expected) sequence of data bits for the read data burst. In certain aspects, the delay of the CDC 420 (shown in FIGS. 4A and 4B) may be calibrated for each delay setting of the rise time delay or the fall time delay so that edges of the read clock signal are between transitions of the read data bursts.

At block 1230, the delay control circuit 1020 selects one of the delay settings for the rise time delay or the fall time delay of the DA 1010 meeting the one or more timing requirements (e.g., setup and/or hold time requirements). For example, the delay control circuit 1020 may determine a range of delay settings for the rise time delay or the fall time delay meeting the one or more timing requirements, and select the one of the delay settings in the middle of the range.

Figure 13:
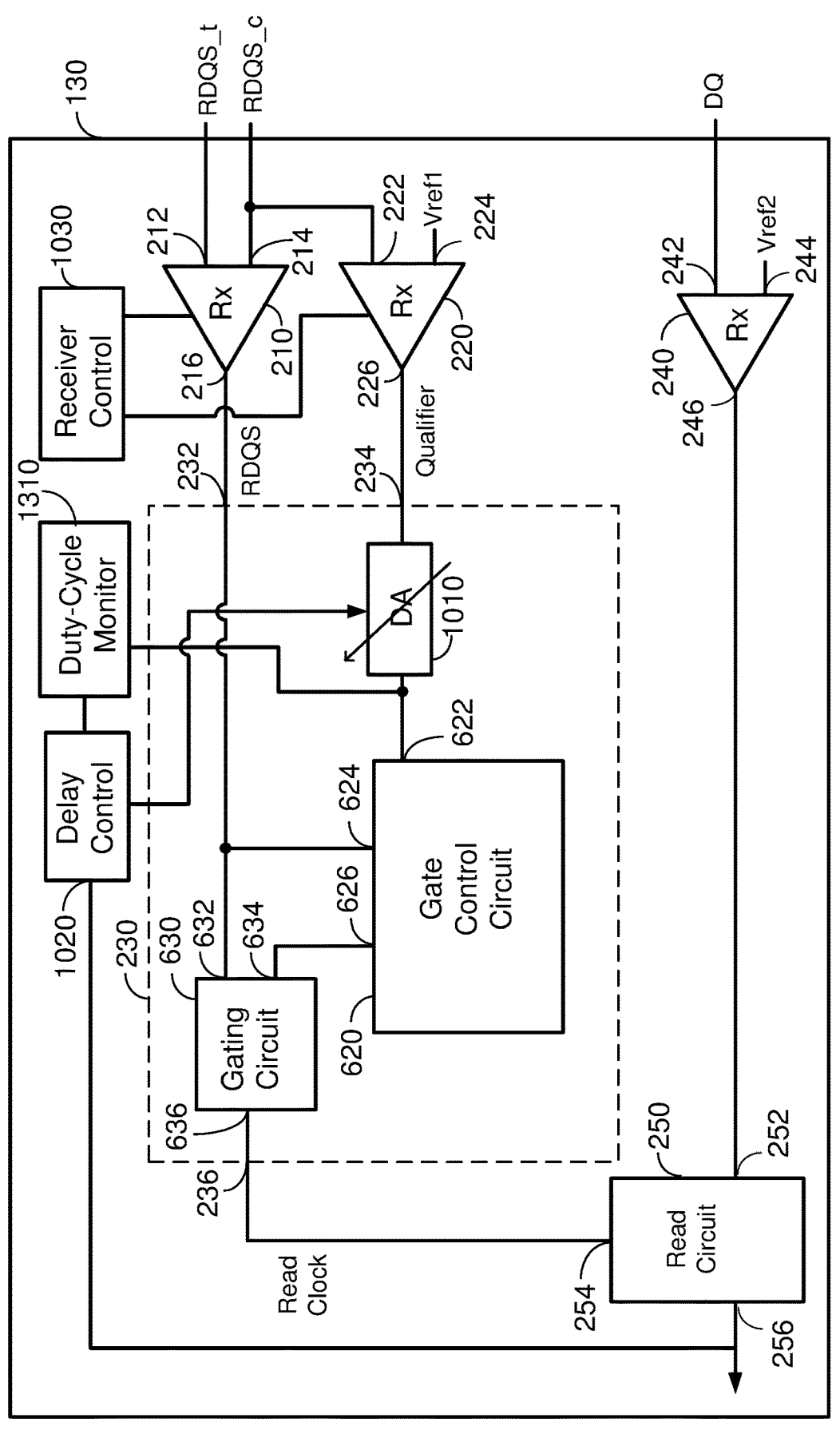
FIG. 13 shows an example in which the memory interface circuit includes a duty-cycle monitor according to certain aspects of the present disclosure.

FIG. 13 shows an example in which the memory interface circuit 130 also includes a duty-cycle monitor 1310 according to certain aspects of the present disclosure. In this example, the duty-cycle monitor 1310 is coupled between the DA 1010 and the first input 622 of the gate control circuit 620 to monitor the duty cycle of the qualifier signal after the DA 1010.

In certain aspects, the duty-cycle monitor 1310 is coupled to the delay control circuit 1020. In this example, the duty-cycle monitor 1310 is configured to detect the duty cycle of the qualifier signal after the DA 1010 and send a signal to the delay control circuit 1020 indicating the detected duty cycle. The delay control circuit 1020 may use the detected duty cycle from the duty-cycle monitor 1310 to execute a duty-cycle monitor routine in which the delay control circuit 1020 adjusts the duty cycle of the qualifier signal (e.g., by adjusting the fall time delay and/or the rise time delay of the DA 1010) until the detected duty cycle is approximately equal to a target duty cycle. For example, during the training method 1200 discussed above, the delay control circuit 1020 may execute the duty-cycle monitor routine for each delay setting of the rise time delay or the fall time delay in block 1220 to adjust the duty cycle of the DA 1010 to the target duty cycle.

Figure 14:
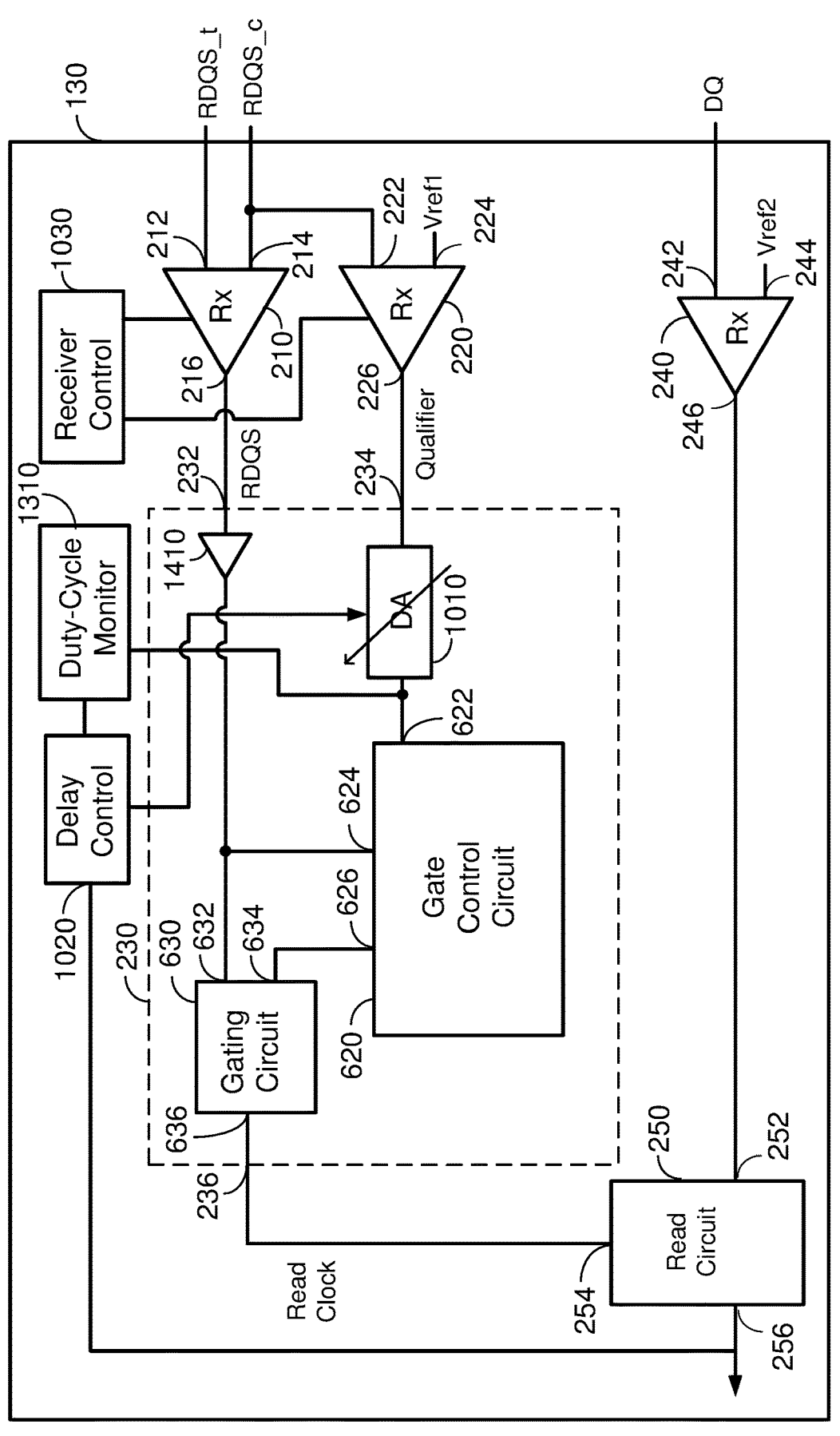
FIG. 14 shows an example in which the memory interface circuit includes a delay buffer according to certain aspects of the present disclosure.

FIG. 14 shows an example in which the memory interface circuit 130 also includes a delay buffer 1410 between the output 216 of the first receiver 210 and the first input 632 of the gating circuit 630. For example, the delay buffer 1410 may be used to add additional delay in the RDQS path to ease the timing closure between the RDQS path and the qualifier path in the RCW circuit 230. For example, in some implementations, the delay of the delay buffer 1410 may match a minimum time delay of the DA 1010.

Figure 15:
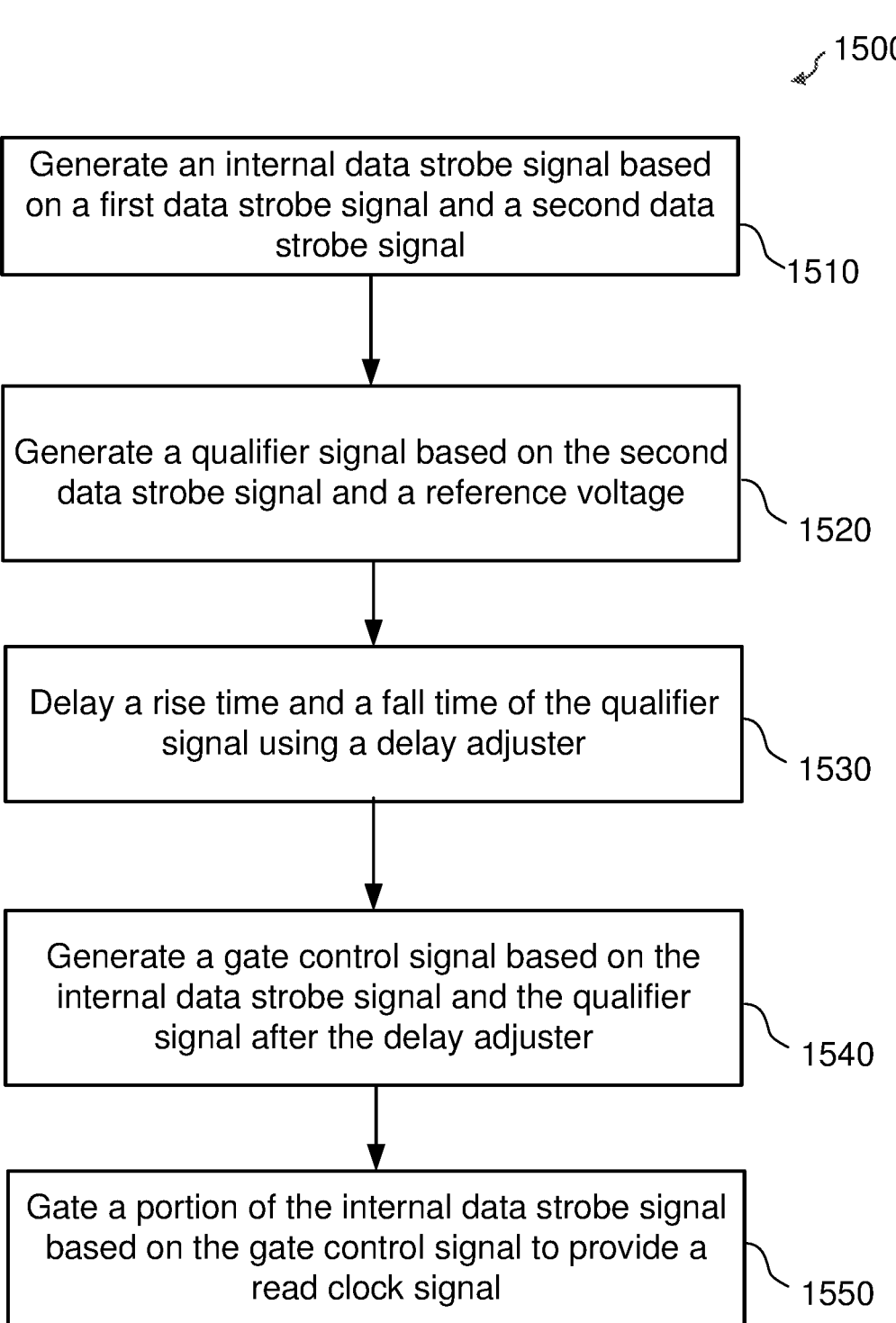
FIG. 15 is a flowchart illustrating an exemplary method for operating a memory interface circuit according to certain aspects of the present disclosure.

FIG. 15 shows an exemplary method 1500 for operating a memory interface circuit (e.g., memory interface circuit 130) according to certain aspects.

At block 1510, an internal data strobe signal is generated based on a first data strobe signal and a second data strobe signal using a first receiver. The internal data strobe signal may correspond to the strobe signal RDQS, the first data strobe signal may correspond to the first strobe signal RDQS_t, and the second data strobe signal may correspond to the second strobe signal RDQS_c. The first receiver may correspond to the first receiver 210.

At block 1520, a qualifier signal is generated based on the second data strobe signal and a reference voltage using a second receiver. The reference voltage may correspond to the first reference voltage Vref1 and the second receiver may correspond to the second receiver 220.

At block 1530, a rise time and a fall time of the qualifier signal are delayed using a delay adjuster. The delay adjuster may correspond to the delay adjuster 1010. In certain aspects, the delay of the fall time and the delay of the rise time are different. In certain aspects, the delay of the fall time and the delay of the rise time are independently tuned. In certain aspects, delaying the rise time of the qualifier signal includes delaying a rising edge of the qualifier signal by a rise time delay of the delay adjuster and delaying the fall time of the qualifier signal includes delaying a falling edge of qualifier signal by a fall time delay of the delay adjuster. The rise time delay and the fall time delay may be different in certain aspects.

At block 1540, a gate control signal is generated based on the internal data strobe signal and the qualifier signal after the delay adjuster. For example, the gate control signal may be generated by the gate control circuit 620.

At block 1550, a portion of the internal data strobe signal is gated based on the gate control signal to provide a read clock signal. For example, the portion of the internal data strobe signal may correspond to the preamble 510, and the portion of the internal data strobe signal may be gated by the gating circuit 630.

In certain aspects, generating the gate control signal includes propagating the gate control signal through a qualifier flip-flop and one or more strobe flip-flops, wherein the qualifier flip-flop is clocked by the qualifier signal after the delay adjuster, and each of the one or more strobe flip-flops is clocked by the internal data strobe signal. The qualifier flip-flop may correspond to the qualifier flip-flop 610 and the one or more strobe flip-flops may correspond to any one or more of the strobe flip-flops 640, 650, 820, 825, 830, and 840.

The method 1500 may also include receiving a data signal, and capturing data bits from the data signal on rising edges and falling edges of the read clock signal. For example, the data bits may be captured by the read circuit 250.

The method 1500 may also include providing a first bias current to the first receiver, and providing a second bias current to the second receiver, wherein the second bias current is greater than the first bias current. For example, the first bias current source 1110 may provide the first bias current and the second bias current source 1120 may provide the second bias current.

Implementation examples are described in the following numbered clauses:

1. A memory interface circuit, comprising:
   a first receiver having a first input, a second input, and an output, wherein the first input of the first receiver is configured to receive a first data strobe signal, and the second input of the first receiver is configured to receive a second data strobe signal;
   a second receiver having a first input, a second input, and an output, wherein the first input of the second receiver is configured to receive the second data strobe signal, and the second input of the second receiver is configured to receive a first reference voltage;
   a gating circuit having a first input, a second input, and an output, wherein the first input of the gating circuit is coupled to the output of the first receiver;
   a gate control circuit having a first input, a second input, and an output, wherein the second input of the gate control circuit is coupled to the output of the first receiver, and the output of the gate control circuit is coupled to the second input of the gating circuit; and
   a delay adjuster coupled between the output of the second receiver and the first input of the gate control circuit.

2. The memory interface circuit of clause 1, wherein the delay adjuster has a rise time delay and a fall time delay, and the rise time delay and the fall time delay are different.

3. The memory interface circuit of clause 2, wherein the delay adjuster is configured to independently tune the rise time delay and the fall time delay.

4. The memory interface circuit of clause 2 or 3, wherein the delay adjuster is configured to receive a rise code and a fall code, set the rise time delay based on the rise code, and set the fall time delay based on the fall code.

5. The memory interface circuit of any one of clauses 1 to 4, wherein the gate control circuit comprises:
   a qualifier flip-flop having a clock input, a signal input, and an output, wherein the clock input of the qualifier flip-flop is coupled to the first input of the gate control circuit, and the signal input of the qualifier flip-flop is coupled to a logic value; and one or more strobe flip-flops coupled in series between the output of the qualifier flip-flop and the output of the gate control circuit, wherein each of the one or more strobe flip-flops has a respective clock input coupled to the second input of the gating circuit.

6. The memory interface circuit of clause 5, wherein the logic value is a logic one.

7. The memory interface circuit of any one of clauses 1 to 6, further comprising a delay buffer coupled between the output of the first receiver and the second input of the gate control circuit.

8. The memory interface circuit of any one of clauses 1 to 7, further comprising a receiver control circuit coupled to the first receiver and the second receiver, wherein the receiver control circuit is configured to independently tune a delay of the first receiver and a delay of the second receiver.

9. The memory interface circuit of clause 8, wherein the delay of the second receiver is shorter than the delay of the first receiver.

10. The memory interface circuit of any one of clauses 1 to 9, further comprising:

a first bias current source configured to provide a first bias current for the first receiver; and a second bias current source configured to provide a second bias current for the second receiver, wherein the first bias current and the second bias current are different.

11. The memory interface circuit of clause 10, wherein the second bias current is greater than the first bias current.

12. The memory interface circuit of any one of clauses 1 to 11, further comprising:

a third receiver having a first input, a second input, and an output, wherein the first input of the third receiver is configured to receive a data signal, and the second input of the third receiver is configured to receive a second reference voltage; and a data capture circuit having a data input, a clock input, and an output, wherein the data input of the data capture circuit is coupled to the output of the third receiver, and the clock input of the data capture circuit is coupled to the output of the gating circuit.

13. The memory interface circuit of clause 12, wherein the second reference voltage and the first reference voltage are equal.

14. The memory interface circuit of clause 12 or 13, further comprising a calibrated delay circuit coupled between the output of the gating circuit and the clock input of the data capture circuit.

15. The memory interface circuit of any one of clauses 12 to 14, further comprising a duty-cycle corrector coupled between the output of the third receiver and the data input of the data capture circuit.

16. The memory interface circuit of any one of clauses 1 to 15, further comprising a duty-cycle monitor configured to detect a duty cycle of a qualifier signal between the delay adjuster and the first input of the gate control circuit.

17. The memory interface circuit of clause 16, further comprising a delay control circuit coupled to the duty-cycle monitor, wherein the duty-cycle monitor is configured to output a signal indicating the detected duty cycle, and wherein the delay control circuit is configured to receive the signal indicating the detected duty cycle, and tune a rise time delay or a fall time delay of the delay adjuster based on the signal indicating the detected duty cycle.

18. The memory interface circuit of any one of clauses 1 to 17, further comprising a delay control circuit coupled to the delay adjuster, wherein the delay control circuit is configured to:

sweep a fall time delay or a rise time delay of the delay adjuster to different delay settings;

for each of the delay settings, determine whether one or more timing requirements in the memory interface circuit are met; and select one of the delay settings meeting the one or more timing requirements.

19. A method for operating a memory interface circuit, comprising:

generating an internal data strobe signal based on a first data strobe signal and a second data strobe signal using a first receiver;

generating a qualifier signal based on the second data strobe signal and a reference voltage using a second receiver;

delaying a rise time and a fall time of the qualifier signal using a delay adjuster;

generating a gate control signal based on the internal data strobe signal and the qualifier signal after the delay adjuster; and gating a portion of the internal data strobe signal based on the gate control signal to provide a read clock signal.

20. The method of clause 19, wherein generating the gate control signal comprises propagating the gate control signal through a qualifier flip-flop and one or more strobe flip-flops, wherein the qualifier flip-flop is clocked by the qualifier signal after the delay adjuster, and each of the one or more strobe flip-flops is clocked by the internal data strobe signal.

21. The method of clause 19 or 20, further comprising:

receiving a data signal; and capturing data bits from the data signal on rising edges and falling edges of the read clock signal.

22. The method of clause 21, wherein the portion of the internal data strobe signal comprises a preamble of the internal data strobe signal.

23. The method of any one of clauses 19 to 22, wherein a rise time delay and a fall time delay of the delay adjuster are different.

24. The method of any one of clauses 1 to 23, further comprising:

providing a first bias current to the first receiver; and providing a second bias current to the second receiver, wherein the second bias current is greater than the first bias current.

25. A method for training a delay adjuster in a memory interface circuit, the memory interface circuit including a first receiver, a gating circuit coupled to the first receiver, a gate control circuit coupled to the gating circuit, and a second receiver, wherein the delay adjuster is coupled between the second receiver and the gate control circuit, the method comprising:

sweeping a fall time delay or a rise time delay of the delay adjuster to different delay settings;

for each of the delay settings, determining whether one or more timing requirements in the memory interface circuit are met; and selecting one of the delay settings meeting the one or more timing requirements.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. As used herein, "approximately" means within 90 percent to 110 percent of the stated value.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A memory interface circuit, comprising:
a first receiver having a first input, a second input, and an output, wherein the first input of the first receiver is configured to receive a first data strobe signal, and the second input of the first receiver is configured to receive a second data strobe signal;
a second receiver having a first input, a second input, and an output, wherein the first input of the second receiver is configured to receive the second data strobe signal, and the second input of the second receiver is configured to receive a first reference voltage;
a gating circuit having a first input, a second input, and an output, wherein the first input of the gating circuit is coupled to the output of the first receiver;
a gate control circuit having a first input, a second input, and an output, wherein the second input of the gate control circuit is coupled to the output of the first receiver, and the output of the gate control circuit is coupled to the second input of the gating circuit;
a delay adjuster coupled between the output of the second receiver and the first input of the gate control circuit;
a first bias current source configured to provide a first bias current for the first receiver; and
a second bias current source configured to provide a second bias current for the second receiver, wherein the first bias current and the second bias current are different.

2. The memory interface circuit of claim 1, wherein the delay adjuster has a rise time delay and a fall time delay, and the rise time delay and the fall time delay are different.

3. The memory interface circuit of claim 2, wherein the delay adjuster is configured to independently tune the rise time delay and the fall time delay.

4. The memory interface circuit of claim 2, wherein the delay adjuster is configured to receive a rise code and a fall code, set the rise time delay based on the rise code, and set the fall time delay based on the fall code.

5. The memory interface circuit of claim 1, wherein the gate control circuit comprises:
a qualifier flip-flop having a clock input, a signal input, and an output, wherein the clock input of the qualifier flip-flop is coupled to the first input of the gate control circuit, and the signal input of the qualifier flip-flop is coupled to a logic value; and
one or more strobe flip-flops coupled in series between the output of the qualifier flip-flop and the output of the gate control circuit, wherein each of the one or more strobe flip-flops has a respective clock input coupled to the second input of the gating circuit.

6. The memory interface circuit of claim 1, further comprising a receiver control circuit coupled to the first receiver and the second receiver, wherein the receiver control circuit is configured to independently tune a delay of the first receiver and a delay of the second receiver.

7. The memory interface circuit of claim 1, wherein the second bias current is greater than the first bias current.

8. The memory interface circuit of claim 1, further comprising a duty-cycle monitor configured to detect a duty cycle of a qualifier signal between the delay adjuster and the first input of the gate control circuit.

9. The memory interface circuit of claim 8, further comprising a delay control circuit coupled to the duty-cycle monitor, wherein the duty-cycle monitor is configured to output a signal indicating the detected duty cycle, and wherein the delay control circuit is configured to receive the signal indicating the detected duty cycle, and tune a rise time delay or a fall time delay of the delay adjuster based on the signal indicating the detected duty cycle.

10. The memory interface circuit of claim 1, further comprising a delay control circuit coupled to the delay adjuster, wherein the delay control circuit is configured to:
sweep a fall time delay or a rise time delay of the delay adjuster to different delay settings;
for each of the delay settings, determine whether one or more timing requirements in the memory interface circuit are met; and
select one of the delay settings meeting the one or more timing requirements.

11. A memory interface circuit, comprising:
a first receiver having a first input, a second input, and an output, wherein the first input of the first receiver is configured to receive a first data strobe signal, and the second input of the first receiver is configured to receive a second data strobe signal;
a second receiver having a first input, a second input, and an output, wherein the first input of the second receiver is configured to receive the second data strobe signal, and the second input of the second receiver is configured to receive a first reference voltage;
a gating circuit having a first input, a second input, and an output, wherein the first input of the gating circuit is coupled to the output of the first receiver;
a gate control circuit having a first input, a second input, and an output, wherein the second input of the gate control circuit is coupled to the output of the first receiver, and the output of the gate control circuit is coupled to the second input of the gating circuit;
a delay adjuster coupled between the output of the second receiver and the first input of the gate control circuit;
a third receiver having a first input, a second input, and an output, wherein the first input of the third receiver is configured to receive a data signal, and the second input of the third receiver is configured to receive a second reference voltage; and
a data capture circuit having a data input, a clock input, and an output, wherein the data input of the data capture circuit is coupled to the output of the third receiver, and the clock input of the data capture circuit is coupled to the output of the gating circuit.

12. The memory interface circuit of claim 11, further comprising a calibrated delay circuit coupled between the output of the gating circuit and the clock input of the data capture circuit.

13. The memory interface circuit of claim 11, further comprising a duty-cycle corrector coupled between the output of the third receiver and the data input of the data capture circuit.

14. A method for operating a memory interface circuit, comprising:

generating an internal data strobe signal based on a first data strobe signal and a second data strobe signal using a first receiver;

generating a qualifier signal based on the second data strobe signal and a reference voltage using a second receiver;

delaying a rise time and a fall time of the qualifier signal using a delay adjuster;

generating a gate control signal based on the internal data strobe signal and the qualifier signal after the delay adjuster; and gating a portion of the internal data strobe signal based on the gate control signal to provide a read clock signal, wherein generating the gate control signal comprises propagating the gate control signal through a qualifier flip-flop and one or more strobe flip-flops, wherein the qualifier flip-flop is clocked by the qualifier signal after the delay adjuster, and each of the one or more strobe flip-flops is clocked by the internal data strobe signal.

15. The method of claim 14, further comprising:

receiving a data signal; and capturing data bits from the data signal on rising edges and falling edges of the read clock signal.

16. The method of claim 15, wherein the portion of the internal data strobe signal comprises a preamble of the internal data strobe signal.

17. The method of claim 14, wherein a rise time delay and a fall time delay of the delay adjuster are different.

* * * * *